US008912428B2

(12) United States Patent
Sivananthan et al.

(10) Patent No.: US 8,912,428 B2
(45) Date of Patent: Dec. 16, 2014

(54) HIGH EFFICIENCY MULTIJUNCTION II-VI PHOTOVOLTAIC SOLAR CELLS

(75) Inventors: Sivalingam Sivananthan, Naperville, IL (US); Wayne H. Lau, Ann Arbor, MI (US); Christoph Grein, Wheaton, IL (US); James W. Garland, Aurora, IL (US)

(73) Assignee: EPIR Technologies, Inc., Bolingbrook, IL (US)

( * ) Notice: Subject to any disclaimer, the term of this patent is extended or adjusted under 35 U.S.C. 154(b) by 609 days.

(21) Appl. No.: 12/261,827

(22) Filed: Oct. 30, 2008

(65) Prior Publication Data

US 2010/0096001 A1    Apr. 22, 2010

Related U.S. Application Data

(63) Continuation-in-part of application No. 12/256,247, filed on Oct. 22, 2008, now abandoned.

(51) Int. Cl.
*H01L 31/00* (2006.01)
*H01L 31/0687* (2012.01)

(52) U.S. Cl.
CPC .......... *H01L 31/0687* (2013.01); *Y02E 10/544* (2013.01)
USPC ............................................. 136/255

(58) Field of Classification Search
CPC ............ H01L 31/0272; H01L 31/0687; H01L 31/0725; H01L 31/073; H01L 31/074
USPC ........................ 136/260, 261, 264
See application file for complete search history.

(56) References Cited

U.S. PATENT DOCUMENTS

| 4,001,864 A | 1/1977 | Gibbons |
| 4,163,987 A | 8/1979 | Kamath et al. |
| 4,191,593 A | 3/1980 | Cacheux |
| 4,206,002 A | 6/1980 | Sabnis et al. |
| 4,278,474 A | 7/1981 | Blakeslee et al. |
| 4,332,974 A | 6/1982 | Fraas |
| 4,338,480 A | 7/1982 | Antypas et al. |

(Continued)

FOREIGN PATENT DOCUMENTS

| EP | 0248953 A1 * | 12/1987 |
| WO | WO 2009082816 A1 * | 7/2009 |

OTHER PUBLICATIONS

Otfried, Madelung, "Semiconductors: Data Handbook," 2004, Sections 3.5-3.19.12, Springer-Verlag Berlin Heidelberg, New York.

(Continued)

*Primary Examiner* — Eli Mekhlin
(74) *Attorney, Agent, or Firm* — Perkins IP Law Group LLC; Jefferson Perkins (57) ABSTRACT

A Group II-VI photovoltaic solar cell comprising at least two and as many as five subcells stacked upon one another. Each subcell has an emitter layer and a base layer, with the base of the first subcell being made of silicon, germanium, or silicon-germanium. The remaining subcells are stacked on top of the first subcell and are ordered such that the band gap gets progressively smaller with each successive subcell. Moreover, the thicknesses of each subcell are optimized so that the current from each subcell is substantially equal to the other subcells in the stack. Examples of suitable Group II-VI semiconductors include CdTe, CdSe, CdSeTe, CdZnTe, CdMgTe, and CdHgTe.

16 Claims, 6 Drawing Sheets

(56) References Cited

U.S. PATENT DOCUMENTS

| | | | |
|---|---|---|---|
| 4,575,577 A | 3/1986 | Fraas | |
| 4,631,352 A * | 12/1986 | Daud et al. | 136/249 |
| 4,633,030 A * | 12/1986 | Cook | 136/246 |
| 4,667,059 A | 5/1987 | Olson | |
| 4,710,589 A | 12/1987 | Meyers et al. | |
| 4,753,684 A | 6/1988 | Ondris et al. | |
| 4,926,230 A | 5/1990 | Yamagishi et al. | |
| 4,963,508 A | 10/1990 | Umeno et al. | |
| 5,009,719 A | 4/1991 | Yoshida | |
| 5,223,043 A | 6/1993 | Olson et al. | |
| 5,252,142 A * | 10/1993 | Matsuyama et al. | 136/255 |
| 5,342,453 A | 8/1994 | Olson | |
| 5,405,453 A | 4/1995 | Ho et al. | |
| 5,571,339 A | 11/1996 | Ringel et al. | |
| 5,853,497 A | 12/1998 | Lillington et al. | |
| 6,147,296 A | 11/2000 | Freundlich | |
| 6,252,287 B1 | 6/2001 | Kurtz et al. | |
| 6,281,426 B1 | 8/2001 | Olson et al. | |
| 6,300,557 B1 | 10/2001 | Wanlass | |
| 6,300,558 B1 | 10/2001 | Takamoto et al. | |
| 6,316,715 B1 | 11/2001 | King et al. | |
| 6,340,788 B1 | 1/2002 | King et al. | |
| 6,399,873 B1 | 6/2002 | Sano et al. | |
| 6,419,742 B1 | 7/2002 | Kirk et al. | |
| 6,657,194 B2 | 12/2003 | Ashokan et al. | |
| 6,660,928 B1 | 12/2003 | Patton et al. | |
| 6,906,358 B2 | 6/2005 | Grein et al. | |
| 6,951,819 B2 | 10/2005 | Iles et al. | |
| 7,148,417 B1 | 12/2006 | Landis | |
| 7,217,882 B2 | 5/2007 | Walukiewicz et al. | |
| 7,227,196 B2 | 6/2007 | Burgener, II et al. | |
| 7,309,832 B2 | 12/2007 | Friedman et al. | |
| 7,821,807 B2 | 10/2010 | Velicu et al. | |
| 2001/0035911 A1 * | 11/2001 | Sato et al. | 348/374 |
| 2003/0102432 A1 | 6/2003 | Boieriu et al. | |
| 2006/0225775 A1 * | 10/2006 | Ishihara | 136/244 |
| 2007/0197022 A1 * | 8/2007 | Hails et al. | 438/625 |
| 2009/0065047 A1 | 3/2009 | Fiorenza et al. | |
| 2009/0078310 A1 | 3/2009 | Stan et al. | |
| 2009/0229659 A1 | 9/2009 | Wanlass et al. | |
| 2010/0096001 A1 | 4/2010 | Sivananthan et al. | |
| 2011/0024876 A1 | 2/2011 | Bower et al. | |

OTHER PUBLICATIONS

Sze, S. M., "Semiconductor Devices Physics and Technology", 2nd Edition, John Wiley & Sons, Inc., New York, (1985).
Olson J. M. et al., "A 27.3% efficient Ga0.5In0.5P/GaAs tandem solar cell", Applied Physics Lett. 56 (7), p. 623-625 Feb. 12, 1990).
Takamoto, T. et al., "Over 30% efficient InGaP/GaAs tandem solar cells", Applied Physics Lett. 70 (3), p. 381-383 (Jan. 20, 1997).
Takamoto, T. et al., "Two-Terminal Monolithic In0.5Ga0.5P/GaAs Tandem Solar Cells with a High Conversion Efficiency of Over 30%", Jpn. J. Applied Physics, vol. 36, Part 1, No. 10, p. 6215-6220, (Oct. 1997).
Feteha, M. Y. et al., "The effects of temperature and light concentration on the GaInP/GaAs multijunction solar cell's performance", Renewable Energy 28, 1097-1104 (2003).

Amano, C. et al., "High-efficiency Al0.3Ga0.7As solar cells grown by molecular beam epitaxy", Applied Physics Lett. 51 (14), p. 1075-1077 (Oct. 5, 1987).
Amano, C. et al., "20.2% efficiency Al0.4Ga0.6As/GaAs tandem solar cells grown by molecular beam epitaxy", Applied Physics Lett. 51 (24), p. 1998-2000 (Dec. 14, 1987).
Amano, C. et al., "Fabrication and Numerical Analysis of AlGaAs/GaAs Tandem Solar Cells with Tunnel Interconnections", IEEE Trans. Electron Devices, vol. 36, No. 6, p. 1026-1035 (Jun. 1989).
Yamaguchi, M., "III-V compound multi-junction solar cells: present and future", Solar Energy Materials & Solar Cells 75, 261-269 (2003).
Zide, J. M. O. et al., "Increased efficiency in multijunction solar cells through the incorporation of semimetallic ErAs nanoparticles into the tunnel junction", Applied Physics Lett. 88, 162103, (2006).
King, R. R. et al., "40% efficient metamorphic GaInP/GaInAs/Ge multijunction solar cells", Applied Physics Lett. 90, 183516 (2007).
Geisz, J. F. et al., "High-efficiency GaInP/GaAs/InGaAs triple-junction solar cells grown inverted with a metamorphic bottom junction", Applied Physics Lett. 91, 023502 (2007).
King, R. R. et al., "Advances in High-Efficiency III-V Multijunction Solar Cells", Advances in OptoElectronics, vol. 2007, Article ID 29523 (2007).
Wanlass, M. W. et al., "Lattice-Mismatched Approaches for High-Performance, III-V Photovoltaic Energy Converters", Proceedings of the 31st IEEE Photovoltaic Specialists Conference, Orlando Florida (IEEE, New York, 2005, p. 530.
Wanlass, M. W. et al., "Monolithic, Ultra-Thin GaInP/GaAs/GaInAs Tandem Solar Cells" Proceedings of the Fourth World Conference on Photovoltaic Energy Conversion, Hawaii (IEEE, New York, 2006), p. 729.
Adachi, A., "Properties of Group-IV, III-V, and II-VI Semiconductors", John Wiley & Sons Ltd., West Susses, England, p. 116 (2005).
Granger, R., "Properties of Narrow Gap Cadmium-Base Compounds", Edited by P. Capper, INSPEC, London, p. 429-430 (1994).
Wallace, R. M., "Handbook of Electronic and Photonic Materials", Edited by S. Kasap and P. Capper, Springer Science + Business Media, Inc., New York p. 644-653 (2006).
US Patent and Trademark Office as International Searching Authority, International Search Report and Written Opinion of the International Searching Authority issued on Patent Application No. PCT/US2011/041355 on Oct. 17, 2011.
The International Bureau of WIPO, International Preliminary Report on Patentability issued on Patent Application No. PCT/US2011/041355 on Dec. 23, 2013.
US Patent and Trademark Office as International Searching Authority, International Search Report and Written Opinion of the International Searching Authority issued on Patent Application No. PCT/US2011/040545 on Oct. 4, 2011.
The International Bureau of WIPO, International Preliminary Report on Patentability issued on Patent Application No. PCT/US2011/040545 on Dec. 17, 2013.
U.S. Appl. No. 61/006,206, filed by Rafael Nathôn Kleiman et al. Dec. 31, 2007.

* cited by examiner

HIGH EFFICIENCY MULTIJUNCTION II-VI PHOTOVOLTAIC SOLAR CELLS

RELATED APPLICATIONS

This application is a continuation in part of U.S. patent application Ser. No. 12/256,247 filed 22 Oct. 2008, the specification of which is fully incorporated by reference herein.

BACKGROUND OF THE INVENTION

Photovoltaic solar cells have many applications. Solar cell systems may be connected to an electric utility grid or be used independently. Applications include water heating, residential electric power, electric power for buildings, generation of power for electric utilities, applications in space, military applications, electric power for automobiles, airplanes, etc., and low-power specialty applications. Solar cells may be used in rooftop systems, in sheets rolled out on large flat areas in the desert or elsewhere, on systems that track the motion of the sun to gain the maximum incident solar power, with or without lenses and/or curved reflectors to concentrate the sun's light on small cells, in folding arrays on satellites and spacecraft, on the surfaces of automobiles, aircraft and other objects and even embedded in fabric for clothing, tents, etc.

The primary function of a solar cell is to convert electromagnetic radiation, in particular solar radiation, into electrical energy. The energy delivered by solar radiation at the earth's surface primarily contains photons of energy hv in the range 0.7 eV up to 3.5 eV, mostly in the visible range, with hv related to the wavelength $\lambda$ of the light by $h\nu=1.24$ eV/$\lambda$ ($\mu$m). Although many photons of longer wavelength are incident at the earth's surface they carry little energy.

Most semiconductor devices, including semiconductor solar cells, are based on the p-n junction diode. In a semiconductor, the lowest conduction band and the highest valence band are separated by an energy gap, $E_g$. A semiconductor is transparent to electromagnetic radiation with photons of energy hv less than $E_g$. On the other hand, electromagnetic radiation with $h\nu \geq E_g$ is absorbed. When a photon is absorbed in a semiconductor, an electron is optically excited out of the valence band into the conduction band, leaving a hole (an absence of an electron in a state that normally is filled by an electron) behind. Optical absorption in semiconductors is characterized by the absorption coefficient. The optical process is known as electron-hole pair generation. Electron-hole pairs in semiconductors tend to recombine by releasing thermal energy (phonons) or electromagnetic radiation (photons) with the conservation of energy and momentum.

When incident photons with energy equal to or greater than the energy gap of the semiconductor p-n junction diode are absorbed, electron-hole pairs are generated. Electron-hole pairs generated by the incident photons with energy greater than the band gap are called hot carriers. These photo-generated hot electrons and holes, which reside in the energy band away from the energy band zone center, rapidly give away their excess energy (the energy difference between the total carrier energy and the energy gap) to the semiconductor crystal lattice causing crystal lattice vibrations (phonons), which produce an amount of heat equal to the excess energy of the carriers in the semiconductor. As a result of the photo-generated electrons and holes moving in opposite directions under an electric field within the semiconductor p-n junction diode, electron and hole photocurrents are simultaneously generated. Semiconductor devices based on this operating principle are known as photodiodes. Semiconductor photovoltaic solar cells are based on the same operating principle as the semiconductor p-n junction photodiodes described above.

A conventional single p-n junction photovoltaic solar cell is composed of a very thick (p) and a very thin (n) semiconductor or vice versa. The thick (p−) doped absorber layer on the bottom of the photovoltaic solar cell is called the base, while the thin (n) layer on the top of the photovoltaic solar cell is called the emitter. The ideal efficiency of a photovoltaic solar cell is the percentage of power converted from the absorbed electromagnetic radiation to electrical energy. The photovoltaic solar cell energy conversion efficiency is partially determined by the band gap of the base layer semiconductor.

The advantage of a photovoltaic solar cell with a small energy gap base layer is that more incident photons are absorbed, and hence more electron-hole pairs are generated, producing a relatively high current in the solar cell. One disadvantage of such a photovoltaic solar cell is that the photovoltage is relatively low due to the small energy gap of the absorber. Another disadvantage of a small energy gap photovoltaic solar cell is that hot carriers are generated by the incident photons with energy much greater than the energy gap, and hence the excess energy of the hot carriers produces a large amount of heat in the thermalization process unless the higher energy photons are absorbed before reaching the narrow-gap material.

On the other hand, the advantage of a photovoltaic solar cell with a large energy gap base layer is that the output voltage of the photovoltaic solar cell is relatively high due to the large energy gap of the absorber. In addition, fewer hot carriers are generated because there are fewer photons with energy much greater than the energy gap. The disadvantage of such a photovoltaic solar cell is that a large number of incident photons have energies below the energy gap of the base layer semiconductor and hence are not absorbed, so that the output current is relatively low.

To achieve high energy conversion efficiency for a semiconductor photovoltaic solar cell, a high output voltage and a high current are required. In order to take advantage of narrow and wide band gap photovoltaic materials, a multifunction photovoltaic solar cell architecture approach is employed by stacking a number of photovoltaic solar cells with various base layer energy gaps. By connecting the photovoltaic solar cells in a serial fashion with the base layer energy gaps spanning the entire solar spectrum, optimal energy conversion efficiency could be achieved. But, in practice, the base layer energy gaps of a multijunction solar cell only cover a portion of the entire solar spectrum. To obtain maximum energy conversion efficiency in a multijunction photovoltaic solar cell, each individual solar cell (p-n junction diode) must be fabricated with high electrical and optical quality semiconductors, which can be achieved for lattice matched single-crystal semiconductor systems grown by molecular beam epitaxy (MBE), metal organic chemical vapor deposition (MOCVD), liquid phase epitaxy (LPE), or other epitaxial growth techniques.

In addition, the photocurrent generated in each individual solar cell is optimally identical to that in the others in order to maximize the energy conversion efficiency since the individual solar cells are connected in series and the photocurrent flows through each individual solar cell in a serial fashion. Any excess current due to current mismatching among the individual solar cells is converted into heat in the multijunction photovoltaic solar cell. The photocurrent of a single p-n junction photovoltaic solar cell is proportional to the number of photons absorbed, which varies directly with the thickness and absorption coefficient of the base and emitter layers.

Hence, the thicknesses of the semiconductor layers in a semiconductor multijunction photovoltaic solar cell must be properly designed based on the factors mentioned above in order to match the photocurrent generated in each individual solar cell.

Degenerately alloyed thin ($p^{++}$) and ($n^{++}$) tunnel junctions (TJ) are used as electrical circuit interconnects in a large number of multijunction photovoltaic solar cells to increase the solar energy conversion efficiency. The tunnel junctions are designed with minimal resistance and voltage drops across the junctions because the photovoltaic voltage of a multijunction solar cell is the sum of the photovoltaic voltage of the individual cells minus the voltage drops across the electrical circuit interconnects and contacts. A typical tunnel junction consists of an interface of heavily alloyed ($p^{++}$) and ($n^{++}$) layers with a narrow depletion layer in which a thin barrier is formed for electron tunneling. The separation of photo-generated electron-hole pairs due to the space-charge electric field induces a voltage drop across the tunnel diodes. In order to maximize the solar energy conversion efficiency, the voltage losses in the tunnel diodes must be minimized, and in addition the current of the individual photovoltaic cells must be matched. Under forward bias, electrons tunnel from the ($n^{++}$) alloyed to ($p^{++}$) alloyed layers, while electrons tunnel from ($p^{++}$) alloyed to ($n^{++}$) alloyed layers under reverse bias.

To further improve the solar energy conversion efficiency of the photovoltaic solar cells, three-junction device structures have been employed. To date, Group III-V three-junction photovoltaic solar cells have been the most successful solar cell device architectures in terms of solar energy conversion efficiencies. Examples of such Group III-V three-junction photovoltaic solar cells are InGaP/GaAs/Ge and InGaP/InGaAs/Ge photovoltaic solar cells that are grown on Ge substrates by MBE or MOCVD. These cells have a conversion efficiency of approximately 40%. Other photovoltaic solar cell device structures with similar solar energy conversion efficiencies are the InGaP/GaAs/InGaAs three-junction photovoltaic solar cells grown on GaAs substrates by MBE or MOCVD. To optimize the total output current, degenerately alloyed ($p^{++}$)GaAs/($n^{++}$) GaAs, ($p^{++}$) AlGaAs/($n^{++}$) InGaP, and ($p^{++}$)AlGaAs/($n^{++}$) GaAs tunnel junctions are often used.

Multijunction photovoltaic solar cells with four, five, and six junctions grown on Ge substrates have been proposed to achieve solar energy conversion efficiency greater than 45%. Examples of such Group III-V cells include AlInGaP/AlInGaAs/InGaAs/Ge, AlInGaP/AlInGaAs/InGaAs/InGaNAs/Ge, and AlInGaP/InGaP/AlInGaAs/InGaAs/InGaNAs/Ge. The tunnel junctions used in these multijunction photovoltaic solar cells are similar to those used in the three-junction photovoltaic solar cells described above.

Important considerations for achieving high-efficiency energy conversion include the following: a) high quality crystalline layers; b) an appropriate choice of junction band gaps based on the impinging solar spectrum; c) tunnel junction interconnects between p-n junctions; d) an appropriate choice of layer thicknesses to achieve a current-matched structure; and e) passivating layers, such as back-surface-field layers or window layers, to reduce losses.

In the past, high-efficiency III-V semiconductor multi-junction solar cells have been grown on GaAs, InP, and Ge substrates, but silicon substrates are advantageous for reasons of cost and mechanical robustness. The current multijunction single-crystal III-V solar cells grown on Ge substrates cost approximately \$13/cm$^2$, compared with approximately 2¢/cm$^2$ for crystalline Si solar cells. However, sunlight incident on a small solar cell can be multiplied by a factor of 600 in a concentrator photovoltaic (CPV) system that tracks the sun to an accuracy of better than 1°. Thus, the cell cost per watt of electric power produced by a multijunction cell in a CPV system can be less than that of a Si cell in a flat plate system.

Previous efforts on the development of multijunction single-crystal solar cells have focused almost entirely on III-V materials for two compelling reasons. First, according to the commonly accepted wisdom, epitaxial growth is best performed on lattice matched substrates and on lattice matched epilayers, and it is very difficult to lattice match substrate material for the growth of appropriate II-VI layers for solar cells, whereas the GaInP/GaAs/Ge system is almost perfectly lattice matched and has an almost ideal set of energy gaps for a three-junction solar cell. See U.S. Pat. Nos. 6,657,194 and 6,906,358, which are specifically incorporated by reference.

Second, III-V materials and their doping and contacting are very familiar to many workers because of their widespread use in the electronics industry, whereas II-VI materials have been used only on a much more limited basis. Some representative patents for III-V based solar cells for CPV systems and previous cells using GaAs substrates are U.S. Pat. Nos. 4,163,987, 4,191,593, 4,206,002, 4,332,974, 4,575,577, 4,667,059, 4,926,230, 5,009,719, 5,342,453, 5,405,453, 5,853,497, 6,147,296, 6,252,287, 6,281,426, 6,300,557, 6,300,558, 6,660,928, 6,951,819, and 7,217,882.

In general, even a completely successful growth of a three-junction single-crystal III-V solar cell on Si would not solve all of the problems associated with multifunction III-V solar cells. In particular, the growth of III-V materials by MOCVD using hydrogen, arsine, phosgene and the other necessary precursor gases introduces a number of difficulties. This method of growth requires elaborate safety precautions and makes regulatory approval difficult. Also, in this method deposits appear rapidly in the growth chamber, which combined with the nature of the deposits implies high maintenance costs and much down time. These considerations make the development of II-VI multifunction single-crystal cells grown by MBE, as proposed in the present invention, very desirable.

The number of relevant patents dealing with Group II-VI solar cells is very limited. U.S. Pat. No. 4,710,589 teaches a heterojunction p-i-n photovoltaic cell having at least three different semiconductor layers formed of at least four different elements comprising a (p−) relatively wide band gap semiconductor layer, a high resistivity intrinsic semiconductor layer, used as an absorber of light radiation, and an (n) relatively wide band gap semiconductor layer. In the preferred embodiment ZnTe is employed as the (p) layer, CdTe as the intrinsic absorber layer, and CdS as the (n) layer.

U.S. Pat. No. 4,753,684 proposes a cell having only a single polycrystalline absorber layer. The proposed cell structure includes a relatively wide optical bandgap energy window layer, a light-absorbing layer and a third, relatively wide bandgap energy layer that forms a minority carrier mirror with the light-absorbing layer. It is realized using II-VI semiconductor compounds such as a CdS or ZnS window layer, a HgCdTe, CdTe, ZnCdTe or HgZnTe light absorbing layer and a third layer of CdTe, ZnTe, ZnCdTe, HgZnTe or CdMnTe. Cd and Te are present in at least two of the three layers of the proposed structures.

U.S. Pat. No. 6,419,742 proposes a method for the growth of high quality lattice mismatched II-VI semiconductor epitaxial layers on Si. This third patent proposes the formation of a passivation layer on a Si surface before the MBE growth of a II-VI material such as CdS. The passivation layer may comprise arsenic, germanium or $CaF_2$.

Thus, there exists a need for low cost, highly efficient solar cells to help meet the power needs of the future. If ultrahigh efficiency multifunction II-VI solar cells could be manufactured by MBE using Si substrates, their manufacture would be easier to scale up than the manufacture of the corresponding III-V cells and would be substantially less expensive than even the corresponding III-V cells grown on Si substrates.

The only public disclosure of significant relevance to this invention originated from the first inventor, Prof. S. Sivananthan. He contracted Prof. M. Flatte of the University of Iowa to perform calculations of the possible theoretical efficiency of II-VI HgCdZnTe solar cells. The idea was confined to single-junction and two-junction solar cells with an unspecified substrate which was not an active part of the solar cell. There was no thought of applications to CPV systems or to applications in space. No publications resulted, only a workshop talk on the calculations by one of Prof. Flatte's students: "HgCdZnTe Materials for High-Efficiency Tandem Solar Cells", B. Brown, M. E. Flatté, P. Boieriu, and S. Sivananthan, the 1998 U.S. Workshop on the Physics and Chemistry of II-VI Materials, Charleston, S.C., Oct. 21, 1998. No printed publication of these calculations was made and there was insufficient information in the art at the time to reduce these cells to practice.

SUMMARY OF THE INVENTION

The present invention generally relates to a Group II-VI photovoltaic solar cell having at least two and as many as five subcells that gives conversion efficiencies approximately as good as or better than the best previously achieved using other semiconductor families. The subcells use combinations of materials that are easier and much less expensive to manufacture. These solar cells can be manufactured by MBE at a cost less than one fifth that of existing or previously proposed multifunction solar cells having similar efficiencies.

In one aspect of the present invention, a monolithic multifunction photovoltaic solar cell comprises a first and a second subcell. The first subcell has a first base and a first emitter formed of opposite conductivity types, and the second subcell has a second base and a second emitter formed of opposite conductivity types. At least one of the bases and emitters is formed of a Group IV semiconductor material. At least one of the bases and emitters is formed of a Group II-VI semiconductor material. When incident solar radiation of a predetermined intensity not absorbed in the second (top) subcell impinges on the upper face of the first subcell, the current density of the photovoltaic current generated in the first subcell will be substantially the same as the current density from this radiation generated in the second subcell.

In further embodiments of the invention, third, fourth and fifth subcells can be formed with respective third, fourth and fifth bases and emitters, the alloying and thickness of all of the bases and emitters being controlled such that the current density in any one of the subcells substantially matches the current density of the rest. It is preferred that the base of the first subcell be formed from a silicon substrate while the rest of the solar cell be grown from II-VI semiconductor materials, such as CdS, CdSe, CdTe, ZnTe, ZnS, MgTe, CdSeTe, CdZnTe, CdMnTe, CdMgTe and CdHgTe. It is also preferred that an antireflection layer be formed above the topmost subcell from a material selected from the group consisting of $Cd_2SnO_4$, $SnO_2$, ZnSe, $TiO_2$, MgTe, ZnO, ZnS, MgSe, ITO, MgS, MgO, $SiO_2$ and $MgF_2$.

In a further aspect of the invention, a monolithic multijunction photovoltaic solar cell is provided which has at least first and second subcells, each with respective bases and emitters formed to be of opposed conductivity types. At least one of the first and second bases and the first and second emitters is formed of a Group IV semiconductor material, while at least one of the first and second bases and the first and second emitters is formed of a Group II-VI semiconductor material. None of the bases or emitters are formed of Group III-V semiconductor material. The solar cell has an ideal series energy conversion efficiency of at least approximately 40%.

It is preferred that this solar cell further include a first tunnel junction between the first and second subcells, with an energy gap of at least one of its layers being greater than the energy gap of the first base.

This provided solar cell can likewise include third, fourth and even fifth subcells. Preferably, tunnel junctions are formed between adjacent subcells. With three subcells, in theory an overall ideal series efficiency of 40% can be achieved under concentrated sunlight, such as 500 suns. This is approximately the same as the theoretical efficiency of a Group III-V solar cell with three subcells, calculated under the same assumptions. According to the invention, this number rises to 45% for structures with four subcells under 500 suns, and 50% for cells with five subcells under 500 suns. Indeed, the invention provides numerous photovoltaic solar cell embodiments having no Group III-V semiconductors but still having overall ideal series efficiencies in excess of 45% in theory under 500 suns illumination.

In another embodiment of the invention, a monolithic multijunction photovoltaic solar cell comprises a first subcell comprising a first base formed of a semiconductor having a first base energy gap and an emitter formed to adjoin the first base and having a first emitter energy gap higher than the first base energy gap. The solar cell includes at least a second subcell formed over the first subcell and comprising a second base formed of a Group II-VI semiconductor material and having a second base energy gap higher than that of the first base, and a second emitter formed of Group II-VI semiconductor material formed to adjoin the second base and having a second emitter energy gap higher than of the first emitter.

In a still further aspect of the invention, a monolithic multijunction photovoltaic solar cell is provided which has at least first and second subcells, with the second subcell being formed over the first. The first subcell includes a first base of a first conductivity type and a first emitter of an opposite conductivity type. The second subcell likewise includes a second base of the first conductivity type and a second emitter of the opposite conductivity type. The second base and emitter are formed of Group II-VI semiconductor material. The energy gap of the second base is higher than the energy gap of the first base, while the energy gap of the second emitter is higher than the energy gap of the first emitter. It is preferred that the first base of this cell be formed of a Group IV semiconductor material, such as Si, Ge or mixtures thereof.

This solar cell can also be built with third, fourth and even fifth subcells over the first and second subcells. Bandgaps of the bases of such subcells will be higher than bandgaps of the bases below them. Similarly, energy bandgaps of the emitters of such subcells will be higher than the bandgaps of the emitters formed below them. The additional subcells are formed of Group II-VI semiconductor materials, preferably by an MBE method.

As in the other embodiments, it is preferred that degeneratively alloyed tunnel junctions be formed between adjacent ones of the subcells, and that the subcell stack be capped with an antireflective coating with a bandgap higher than that of the subcell layer beneath it. This antireflective coating prevents damage from overly energetic impinging photons and is particularly important in outer space or other high-radiation environments.

BRIEF DESCRIPTION OF THE DRAWINGS

Further aspects of the invention and their advantages can be discerned in the following detailed description, in which.

DETAILED DESCRIPTION

The multijunction photovoltaic solar cell of the invention may comprise a plurality of subcells each of which convert solar radiation into electrical energy. In various preferred embodiments of the multijunction photovoltaic solar cell, the subcells with different energy gaps absorb different components of the solar radiation spectrum enabling more efficient conversion of incident solar energy into electrical energy. The subcells comprise material systems of different energy gaps corresponding to different optical absorption cutoff energies such that incident light in different spectral ranges is efficiently absorbed by the different subcells. The subcells with larger energy gaps are stacked on top of the subcells with smaller energy gaps so that the upper subcells absorb the photons of the incident light with energies equal to or greater than the energy gaps of the upper subcells allowing the unabsorbed photons of the incident light to be transmitted through the upper subcells and subsequently absorbed by the lower subcells with smaller energy gaps. In preferred embodiments of the present invention, relatively high energy gap tunnel junctions that are used as low-resistance electrical circuit interconnects are placed between the subcells. Solar cells according to the present invention provide higher open-circuit photovoltages and higher short-circuit photocurrent densities as well as lower series resistance losses. The solar cells of the present invention also facilitate current matching through each of the subcells to increase solar energy conversion efficiency.

Without limitation, the present invention is applicable to photovoltaic solar cells for both terrestrial and non-terrestrial applications, photodiode detectors, light-emitting diodes, and semiconductor diode lasers.

Various embodiments of the present invention involve fabricating a monolithic photovoltaic solar cell comprising a plurality of the subcells in a fabrication sequence wherein the lower subcells with small energy gaps are usually fabricated first, while the upper subcells with larger energy gaps are subsequently fabricated on the top of the lower subcells. The subcells of the present invention can be fabricated by material growth methods such as MBE, MOCVD, and LPE. Layer thicknesses and alloying of the semiconductor thin layers that form the subcells of the multijunction photovoltaic solar cell can be controlled and optimized by adjusting the different raw material compositions, flux rates and deposition durations during the growth to meet the requirements of the specific design for a photovoltaic solar cell.

Figure 1:
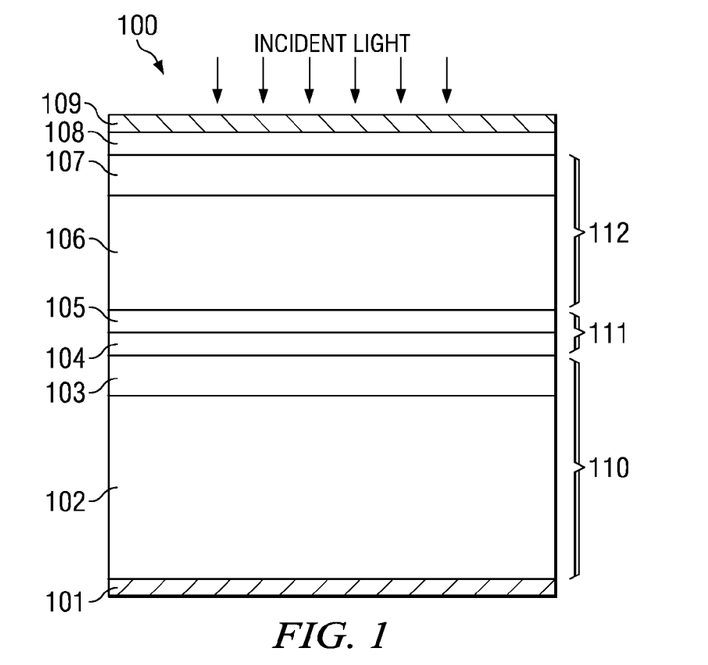
FIG. 1 is a highly magnified schematic elevational sectional view of a two junction photovoltaic solar cell according to a first embodiment of the present invention.

In the exemplary cell 100 illustrated in FIG. 1, a first subcell 110, which is made of a first material system, comprises a first (p)Si base layer 102 and a first (n)Si emitter layer 103 having a first base energy gap ($E_{g1B} \approx 1.10$ eV), a first emitter energy gap ($E_{g1E} \approx 1.10$ eV), and a first layer thickness ($d_1 \approx 1.0$ to 500 µm, preferably greater than 2 µm) for different applications. The subcell 110 can be formed from a beginning silicon substrate on which the rest of the cell 100 is grown by MBE or otherwise formed. This fabrication methodology may be employed for each of the embodiments illustrated herein. A second subcell 112, which is formed over the first subcell 110, to be in optical communication therewith, and in this embodiment with a tunnel junction 111 between the two, is made of a second material system, comprising a second (p)CdTe base layer 106 and a second (n+)CdTe emitter layer 107 respectively having a second base energy gap ($E_{g2B} \approx 1.51$ eV), a second emitter energy gap ($E_{g2E} \approx 1.51$ eV), and a second layer thickness ($d_2 \approx 0.5$ to 15 µm, more preferably 2-6 µm). The degenerately alloyed first tunnel junction 111 between the first subcell 110 and second subcell 112 comprises a first (p++)ZnTe base layer 104 and a first (n++)ZnTe emitter layer 105 having a base energy gap ($E_{gTJB} \approx 2.26$ eV) and an emitter energy gap ($E_{gTJE} \approx 2.26$ eV) which are relatively high in comparison with the energy gaps of the adjoining layers. The first tunnel junction is made of relatively thin semiconductor layers ($d_{TJ1} \approx 0.005$ to 0.1 µm) in order to minimize the absorption of incident light within the tunnel junction and hence reduce optical power loss.

In this first embodiment of the invention, the material system that is used for the first tunnel junction 111 is not limited to ZnTe semiconductors, but can be made from other relatively high energy gap materials such as CdS ($E_{gCdS} \approx 2.46$ eV), ZnSe ($E_{gZnSe} \approx 2.72$ eV), MgTe ($E_{gMgTe} \approx 3.40$ eV), ZnS ($E_{gZnS} \approx 3.73$ eV), CdZnTe ($E_{gCdZnTe} \approx 1.8$ to 2.26 eV), CdMgTe ($E_{gCdMgTe} \approx 1.8$ to 3.3 eV), CdMnTe ($E_{gCdMnTe} \approx 1.8$ to 2.92 eV), and ZnMnSe ($E_{gZnMnSe} \approx 2.8$ to 3.30 eV) compound semiconductors. The energy gaps ($E_{gTJ1B}$ and $E_{gTJ1E}$) of the first tunnel junction 111 must be greater than those of the first emitter 103 ($E_{g1E}$) of the first subcell 110 and the second base 106 ($E_{g2B}$) of the second subcell 112. In addition, the (p++) and (n++) tunnel junction with homo-interface (homojunction) can be replaced by a tunnel junction with a hetero-interface (heterojunction) that comprises thin layers semiconductor material having different energy gaps. The first tunnel junction is designed in such a way that the tunneling current density ($I_{TJ1}$) at the valley is greater than the overall short-circuit photocurrent density ($I_{sc}$) of the two-junction photovoltaic solar cell 100 in order to minimize the electrical power loss at the interfaces between the first subcell 110, first tunnel junction 111, and second subcell 112.

An antireflective coating 108, such as a highly transparent thin ZnO semiconductor layer, is formed over (here, immediately adjoining) the second subcell 112 to minimize surface reflections, thereby enabling more photons of the incident light to enter the photovoltaic solar cell, and it is also used as an encapsulant for radiation hardening to improve radiation tolerance against damage from high energy photons and charged particles. The antireflective layer 108 has a relatively wide energy gap ($E_{gARC} \approx 3.20$ eV) in comparison to the energy gap of the subcells 110 and 112 that it is protecting, and a relatively thin layer thickness ($d_{ARC} \approx 0.05$ to $0.5$ μm). In this first preferred embodiment of the present invention, the antireflective coating 108 is not limited to ZnO semiconductor thin layer, and the antireflection coating can also be made from other materials such as $Cd_2SnO_4$ ($E_{gCd2SnO4} \approx 3.07$ eV), $SnO_2$ ($E_{gSnO2} \approx 4.01$ eV), ZnSe ($E_{gZnSe} \approx 2.72$ eV), $TiO_2$ ($E_{gTiO2} \approx 3.30$ eV), MgTe ($E_{gMgTe} \approx 3.40$ eV), ZnS ($E_{gZnS} \approx 3.73$ eV), MgSe ($E_{gMgSe} \approx 4.00$ eV), Indium Tin Oxide (ITO; $E_{gITO} \approx 4.06$ eV), MgS ($E_{gMgS} \approx 4.45$ eV), MgO ($E_{gMgO} \approx 7.80$ eV), $SiO_2$ ($E_{gSiO2} \approx 8.90$ eV), and $MgF_2$ ($E_{gMgF2} \approx 10.8$ eV). In addition, the antireflection coating 108 can be made by stacking together multiple thin layers of appropriate thicknesses from the materials described above to further reduce the reflection of the incident light at the top surfaces.

A back contact 101 can be made from metals for good ohmic contacts such as $CoSi_2$, $TiSi_2$, $WSi_2$, $TaSi_2$, PtSi, and Al, and may be made of a metal grid, metal thin layer, or a semi-transparent conducting thin layer. A front contact 109, formed over subcells 110 and 112 in opposition to the back contact 101, is in this embodiment deposited or grown on the antireflection coating 108, can be made from metals such as Au and Cu or transparent conductive oxides (TCOs) such as $Cd_2SnO_4$, $SnO_2$, ZnO, and indium tin oxide, and may be a metal grid or a TCO thin layer.

In this first embodiment of the invention, light that is incident on the top surface of the two-junction photovoltaic solar cell 100 is partially reflected and partially transmitted through the contact layer 109 and the antireflection coating 108. The transmitted photons with energies ($E_{ph} \geq E_{g2B}$) equal to or greater than the second base energy gap of the second subcell 112 are absorbed in the second subcell 112, producing a second short-circuit photocurrent density ($I_{sc2}$) and a second open-circuit photovoltage ($V_{oc2}$). The photons with energies ($E_{ph} < E_{g2B}$) less than the second base energy gap of the second subcell 112 pass through the second subcell 112 and the first tunnel junction 111, arriving at the top of the first subcell 110. The transmitted photons with energies ($E_{ph} \geq E_{g1B}$) equal to or greater than the first base energy gap of the first subcell 110 are absorbed in the first subcell 110, producing a first short-circuit photocurrent density ($I_{sc1}$) and a first open-circuit photovoltage ($V_{oc1}$). The layer thicknesses of the first subcell 110 and second subcell 112 are preferably chosen, varied and optimized so that the first short-circuit photocurrent density for the first subcell 110 and second short-circuit photocurrent density for the second subcell 112 are matched completely ($I_{sc1} = I_{sc2}$) or substantially ($I_{sc1} \approx I_{sc2}$).

In specific examples of the invention, the short-circuit photocurrent densities, open-circuit voltages, and energy conversion efficiencies of each subcell were calculated using numerical modeling via a finite element method (FEM). In order to compare the upper limit performance of photovoltaic solar cell devices with different architectures, ideal operating conditions were used in the numerical simulations presented herein unless explicitly stated otherwise.

In the following specific examples, the calculations were based on the solar spectral irradiance of 500 suns at air mass 1.5 with global 37° tilt (AM1.5G) under ideal operating conditions wherein the losses due to scattering, series resistance, optical reflection and absorption, and electrical collection were assumed to be negligible. The calculated first open-circuit voltage ($V_{oc1}$) for the first subcell 110 and second open-circuit voltage ($V_{oc2}$) for the second subcell 112 are 0.56 V and 1.09 V, respectively, and the estimated open-circuit voltage for the two-junction photovoltaic solar cell 100 ($V_{oc} = V_{oc1} + V_{oc2}$) is $\approx 1.65$ V. The calculated optimal first short-circuit photocurrent density ($I_{sc1}$) for the first subcell 110 and second short-circuit photocurrent density ($I_{sc2}$) for the second subcell 112 are 40 mA/cm² and 27 mA/cm², respectively. From these calculations, the estimated series-matched short-circuit photocurrent density ($I_{sc}$) for the two-junction photovoltaic solar cell 100 is approximately 27 mA/cm², and $I_{sc} = I_{TJ1} = I_{sc1} = I_{sc2}$ as discussed above. The estimated ideal series-interconnected efficiencies for the first subcell 110 ($\eta_1$) and second subcell 112 ($\eta_2$) are 13% and 27%, respectively, and the estimated ideal series-interconnected efficiency ($\eta = \eta_1 + \eta_2$) for the two-junction photovoltaic solar cell 100 is approximately 40% under concentrated sunlight.

In one variation of the first embodiment, the first subcell 110 and second subcell 112 of this homo-junction photovoltaic solar cell 100 can be replaced with hetero-junction subcells to further improve performance by minimizing the absorption in the first emitter 103 and second emitter 107 while maximizing the absorption in the first base 102 of first subcell 110 and second base 106 of the second subcell 112. The first base formed of a semiconductor layer may be Si, Ge, or an SiGe mixture or alloy, and the second CdTe semiconductor base 106 ($\approx 1.51$ eV) may be replaced with alloys of CdSe, CdSeTe ($E_{g1E}=1.51$ to $1.7$ eV), CdZnTe ($E_{g1E}=1.51$ to $2.0$ eV), CdMgTe ($E_{g1E}=1.51$ to $2.0$ eV), or CdHgTe ($E_{g1E}=1.3$ to $1.6$ eV) semiconductors.

The first (n+)Si emitter 103 of the first subcell 110 can be replaced with alloys of a (n+) Ge emitter ($E_{g1E} \approx 0.66$ eV), (n+)CdTe emitter ($E_{g1E} \approx 1.51$ eV), (n+)CdSe emitter ($E_{g1E} \approx 1.70$ eV), (n+)ZnTe emitter ($E_{g1E} \approx 2.26$ eV), (n+)CdMnTe emitter ($E_{g1E} \approx 1.51$ to $2.92$ eV), (n+) CdHgTe emitter ($E_{g1E} \approx 1.3$ to $1.6$ eV), (n+)CdSeTe emitter ($E_{g1E} \approx 1.51$ to $1.70$ eV), (n+)CdZnTe emitter ($E_{g1E} \approx 1.51$ to $2.26$ eV), or (n+) CdMgTe emitter ($E_{g1E} \approx 1.51$ to $3.2$ eV) to allow more incident light to reach the first (p−)Si base 102 ($E_{g1B} \approx 1.10$ eV) in order to increase the photo-generation of electron-hole pairs and hence increase the photocurrent of the first subcell 110.

In addition, the second (n+)CdTe emitter 107 of the second subcell 112 can be replaced with alloys of a higher energy gap (n+)CdSe emitter ($E_{g2E} \approx 1.70$ eV), (n+)ZnTe emitter ($E_{g2E} \approx 2.26$ eV), (n+)CdS emitter ($E_{g2E} \approx 2.46$ eV), (n+)ZnSe emitter ($E_{g2E} \approx 2.72$ eV), (n+) MgTe emitter ($E_{g2E} \approx 3.40$ eV), (n+)ZnS emitter ($E_{g2E} \approx 3.73$ eV), (n+)CdSeTe emitter ($E_{g2E} \approx 1.51$ to $1.70$ eV), (n+)CdZnTe emitter ($E_{g2E} \approx 1.51$ to $2.26$ eV), (n+)CdMnTe emitter ($E_{g2E} \approx 1.51$ to $3.0$ eV), or (n+)CdMgTe emitter ($E_{g2E} \approx 1.51$ to $3.2$ eV) to allow more incident light to reach the (p−)CdTe base 106 ($E_{g2B} \approx 1.51$ eV) in order to increase the photo-generation of electron-hole pairs and hence increase the photocurrent of the second subcell 112.

Specifically, numerical modeling was performed for a hetero-interface two-junction photovoltaic solar cell: ARC 108= (n+)ZnO; second subcell 112=(n+)ZnTe/(p−)CdTe; tunnel junction 111=(p⁺⁻)MgTe/(n⁺⁺)MgTe; first subcell 110=(n+)ZnTe/(p)Si. The calculated first open-circuit photovoltage ($V_{oc1}$) for the first subcell 110 and second open-circuit photovoltage ($V_{oc2}$) for the second subcell 112 are ≈0.56 V and ≈1.08 V, respectively. The estimated open-circuit voltage for the thus-specified hetero-interface two-junction photovoltaic solar cell 100 ($V_{oc}=V_{oc1}+V_{oc2}$) is ≈1.64 V. The calculated optimal first short-circuit photocurrent density ($I_{sc1}$) for the first subcell 110 and second short-circuit photocurrent density ($I_{sc2}$) for the second subcell 112 are ≈40 mA/cm² and ≈29 mA/cm², respectively. The estimated series-matched short-circuit photocurrent density ($I_{sc}$) for the hetero-interface two-junction photovoltaic solar cell 100 is approximately 29 mA/cm², and $I_{sc}=I_{TJ1}=I_{sc1}=I_{sc2}$ as discussed above. The estimated ideal series-interconnected efficiencies for the first subcell 110 ($\eta_1$) and second subcell 112 ($\eta_2$) are 14% and 29%, respectively, and the estimated ideal series-interconnected efficiency ($\eta=\eta_1+\eta_2$) for the entire hetero-interface two-junction photovoltaic solar cell 100 is at least ≈43% under 500 suns. In this example, a first (p⁺⁺) MgTe/(n⁻⁺) MgTe tunnel junction 111 is placed between the first subcell 110 and second subcell 112. The antireflection coating 108, which may comprise more than one thin layers, can be made of materials with energy gaps that are greater than the energy gap of the second emitter 107 of the second subcell 112 ($E_{gARC}>E_{g2E}$).

Figure 2:
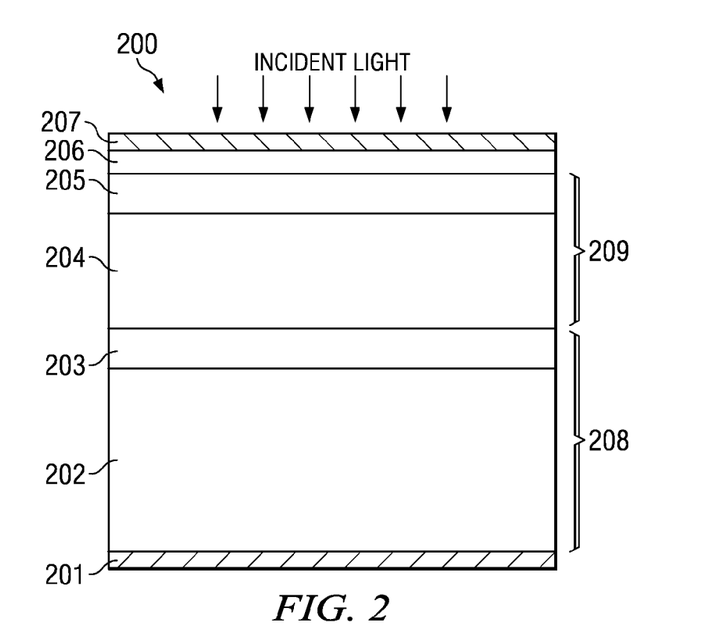
FIG. 2 is a highly magnified schematic elevational sectional view of a two junction photovoltaic solar cell according to a second embodiment of the present invention, without tunnel junctions disposed between the subcells.

The embodiment shown in FIG. 2 is an (n+)ZnO/(n+)CdTe/(p−)CdTe/(n+)Si/(p−)Si two-junction photovoltaic solar cell 200 without a tunnel junction between the subcells 208, 209. In this example, the first subcell 208, which is made of a first material system, comprises a first (p−)Si base layer 202 and a first (n+)Si emitter layer 203 having a first base energy gap ($E_{g1B}$≈1.10 eV), a first emitter energy gap ($E_{g1E}$≈1.10 eV), and a first layer thickness ($d_1$≈1.0 to 500 µm, more preferably greater than 2 µm). The second subcell 209, which is formed over, to adjoin or otherwise be in proximate optical communication with the first subcell 208 and which is made of a second material system, comprises a second (p−) CdTe base layer 204 and a second (n+)CdTe emitter layer 205 having a second base energy gap ($E_{g2B}$≈1.51 eV), a second emitter energy gap ($E_{g2E}$≈1.51 eV), and a second layer thickness ($d_2$≈0.5 to 15 µm, more preferably greater than 2 µm). The first subcell 208 and second subcell 209 of this homo-junction photovoltaic solar cell 200 can be replaced with hetero-junction subcells as described above to further improve light absorption.

In a variation of the embodiments illustrated in FIGS. 1 and 2 of the present invention, the conductivity types of the semiconductor layers of the two-junction photovoltaic solar cell are reversed.

Figure 3:
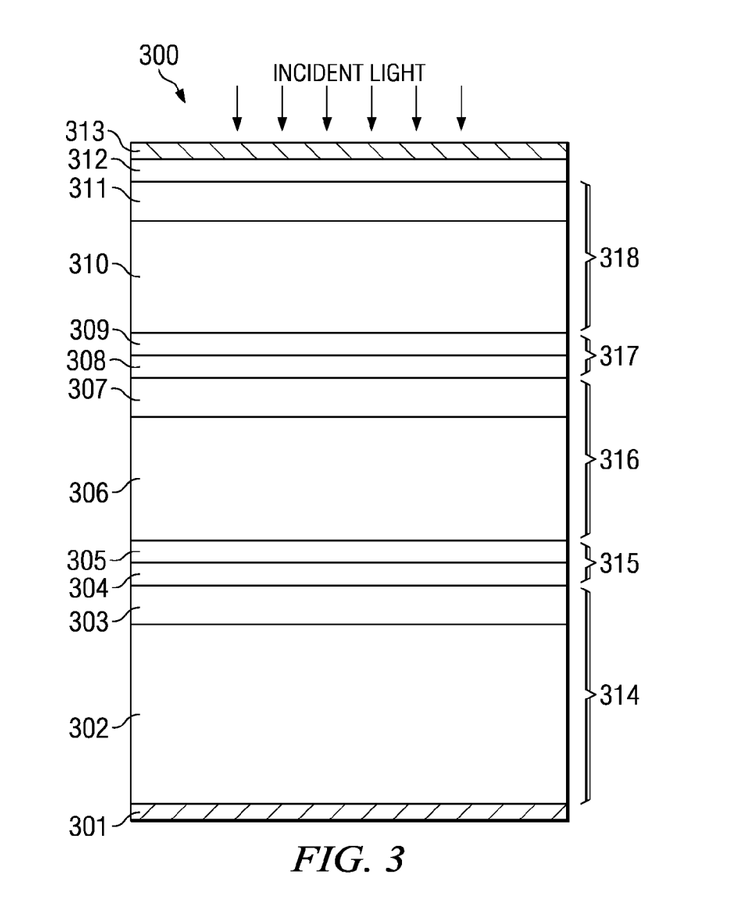
FIG. 3 is a highly magnified schematic elevational sectional view of a three junction photovoltaic solar cell according to a third embodiment of the present invention.

A three-subcell photovoltaic solar cell is schematically illustrated in FIG. 3. This second embodiment encompasses the embodiment shown in FIG. 1 and described above with an additional subcell and preferably a second tunnel junction. The preferred three-subcell photovoltaic solar cell 300 ((n+)ZnO/(n+)Cd$_{1-x}$Zn$_x$Te/(p−)Cd$_{1-x}$Zn$_x$Te/(p⁺⁺)ZnTe/(n⁺⁺) ZnTe/(n+)CdTe/(p−)CdTe/(p⁺⁺)ZnTe/(n⁺⁺)ZnTe/(n+)Si/(p−)Si where the mole fraction x≈0.31) includes a first subcell 314, a second subcell 316 formed over the subcell 314, a third subcell 318 formed over the second subcell 316, a first tunnel junction 315 interposed between subcells 314 and 316, a second tunnel junction 317 disposed between subcells 316 and 318, an antireflection coating 312, formed above the topmost subcell 318 to provide protection against photons with energies higher than the bandgaps of third subcell 318, a front contact 313, and a back contact 301. The third subcell 314, which is disposed immediately adjacent to the second subcell 316 and is made of a third material system, comprises a third (p−)Cd$_{1-x}$Zn$_x$Te base layer 310 and a third (n+)Cd$_{1-x}$Zn$_x$Te emitter layer 311 having a third base energy gap ($E_{g3B}$≈1.6 eV-2.0 eV), a third emitter energy gap ($E_{g3E}$≈1.6 eV-2.0 eV), and a third layer thickness ($d_3$≈0.1 to 10 µm, preferably 2 to 6 µm). The degenerately alloyed second tunnel junction 317 that is placed between the second subcell 316 and third subcell 318 comprises a second (p⁺⁺) ZnTe base layer 308 and a second (n⁺⁺)ZnTe emitter layer 309 having a relatively high base energy gap ($E_{gTJ2B}$≈2.26 eV) and a relatively high emitter energy gap ($E_{gTJ2E}$≈2.26 eV). In this embodiment, the first tunnel junction 315 and second tunnel junction 317 need not be identical and the tunnel junctions 315, 317 can be made from materials of different energy gaps. The energy gaps ($E_{gTJ1B}$ and $E_{gTJ1E}$) of the first tunnel junction 315 must be greater than those of the first emitter 303 ($E_{g1E}$) of the first subcell 314 and the second base 306 ($E_{g2B}$) of the second subcell 316, and the energy gaps ($E_{gTJ2B}$ and $E_{gTJ2E}$) of the second tunnel junction 317 must be greater than those of the second emitter 307 ($E_{g2E}$) of the second subcell 316 and the third base 310 ($E_{g3B}$) of the third subcell 318. Specifically, the first and second tunnel junctions may be alloys of ZnTe, ZnS, MgTe, ZnS, CdZnTe ($E_{gTJ2}$≈2.0 to 2.26 eV), and CdMgTe ($E_{gTJ2}$≈2.0 to 3.2 eV).

Light that is incident on the top surface of the three-junction photovoltaic solar cell 300 is partially reflected and partially transmitted through the contact layer 313 and the anti-reflection coating 312. The transmitted photons with energies ($E_{ph} \geq E_{g3B}$) equal to or greater than the third base energy gap of the third subcell 318 are absorbed in the third subcell 318, producing a third short-circuit photocurrent density ($I_{sc3}$) and a third open-circuit photovoltage ($V_{oc3}$). The photons with energies ($E_{ph}<E_{g3B}$) less than the energy gap of the third subcell 318 pass through the third subcell 318 and the second tunnel junction 317 impinging on the top of the second subcell 316. The transmitted photons with energies ($E_{ph} \geq E_{g2B}$) equal to or greater than the second base energy gap of the second subcell 316 are absorbed in the second subcell 316, producing a second short-circuit photocurrent density ($I_{sc2}$) and a second open-circuit photovoltage ($V_{oc2}$). The photons with energies ($E_{ph}<E_{g2B}$) less than the second base energy gap of the second subcell 316 pass through the second subcell 316 and the first tunnel junction 315 reaching the top of the first subcell 314. The transmitted photons with energies ($E_{ph} \geq E_{g1B}$) equal to or greater than the first base energy gap of the first subcell 314 are absorbed in the first subcell 314, producing a first short-circuit photocurrent density ($I_{sc1}$) and a first open-circuit photovoltage ($V_{oc1}$). The thicknesses of the first subcell 315, second subcell 316, and third subcell 318 are chosen and optimized so that the first short-circuit photocurrent density for the first subcell 314, second short-circuit photocurrent density for the second subcell 316, and third short-circuit photocurrent density for the third subcell 318 are matched completely ($I_{sc1}=I_{sc2}=I_{sc3}$) or substantially ($I_{sc1} \approx I_{sc2} \approx I_{sc3}$).

In a specific example of this three-subcell embodiment, the calculated first open-circuit photovoltage ($V_{oc1}$) for the first subcell 314, second open-circuit photovoltage ($V_{oc2}$) for the second subcell 316, and third open-circuit photovoltage ($V_{oc3}$) for the third subcell 318 are ≈0.53 V, ≈0.97 V, and ≈1.26 V, respectively. The estimated open-circuit photovoltage for the three-subcell photovoltaic solar cell 300 ($V_{oc}=V_{oc1}+V_{oc2}+V_{oc3}$) is 2.76 V. The calculated optimal first short-circuit photocurrent density ($I_{sc1}$) for the first subcell 314, second short-circuit photocurrent photocurrent density ($I_{sc2}$) for the second subcell 316, and third short-circuit density ($I_{sc3}$) for third subcell 318 are ≈40 mA/cm², ≈27 mA/cm², and ≈19 mA/cm², respectively. From these numerical calculations, the estimated series-matched short-circuit photocurrent density ($I_{sc}$) for the three-junction photovoltaic solar cell 300 under concentrated sunlight (500 suns) is approximately 19 mA/cm², and $I_{sc}=I_{TJ1}=I_{TJ2}=I_{sc1}=I_{sc2}=I_{sc3}$ as discussed above. The estimated ideal series-interconnected efficiency ($\eta=\eta_1+\eta_2+\eta_3$) for the three-junction photovoltaic solar cell 300 is at least ≈40%. As described previously, degeneratively alloyed (p++)ZnTe/(n++)ZnTe tunnel junctions 315, 317 may placed between the subcells to improve the light conversion efficiency for cell 300.

Alternatively, the first subcell 314, second subcell 316, and third subcell 318 of this homo-junction photovoltaic solar cell 300 can be replaced with hetero-junction subcells to further improve performance by minimizing the absorption in the first emitter 303 of the first subcell 314, second emitter 307 of the second subcell 316 and third emitter 311 of the third subcell 318, while maximizing the absorption in the first base 302 of first subcell 314, second base 306 of the second subcell 316, and third base 310 of the third subcell 318.

Additionally, the (n+)Cd$_{1-x}$Zn$_x$Te emitter 311 of the third subcell 318 can be replaced with alloys of a higher energy gap (n+)CdSe emitter ($E_{g3E}$≈1.70 eV), (n+)ZnTe emitter ($E_{g3E}$≈2.26 eV), (n+)CdS emitter ($E_{g3E}$≈2.46 eV), (n+)ZnSe emitter ($E_{g3E}$≈2.72 eV), (n+)MgTe emitter ($E_{g3E}$≈3.40 eV), (n+)ZnS emitter ($E_{g3E}$≈3.73 eV), (n+)CdZnTe emitter ($E_{g3E}$≈1.6 to 2.26 eV), (n+)CdMnTe emitter ($E_{g3E}$≈1.6 to 3.2 eV), (n+)CdSeTe emitter ($E_{g3E}$≈1.6 to 1.7 eV), or (n+)CdMgTe emitter ($E_{g3E}$≈1.6 to 3.2 eV) to allow more incident light to reach the (p)Cd$_{1-x}$Zn$_x$Te base 310 ($E_{g3B}$≈1.71 eV) in order to increase the photo-generation of electron-hole pairs and hence increase the photocurrent of the third subcell 318.

The third CdZnTe base 310 ($E_{g3B}$≈1.6 to 2.0 eV) may be replaced with alloys of CdSeTe ($E_{g3B}$=1.6 to 1.7 eV), CdZnTe ($E_{g3B}$=1.6 to 2.0 eV), or CdMgTe ($E_{g3B}$=1.6 to 2.0 eV) semiconductors.

Modeling was performed for a hetero-interface three-junction photovoltaic solar cell having the following top-to-bottom composition: (n+)ZnO/(n+)ZnTe/(p−)Cd$_{1-x}$Zn$_x$Te/(p++)MgTe/(n++)MgTe/(n+)ZnTe/(p−)CdTe/(p++)MgTe/(n++)MgTe/(n+)ZnTe/(p−)Si. The calculated first open-circuit photovoltage ($V_{oc1}$) for the first subcell 314, second open-circuit photovoltage ($V_{oc2}$) for the second subcell 316, and third open-circuit photovoltage ($V_{oc3}$) for the third subcell 318 were ≈0.54 V, ≈0.97 V, and ≈1.26 V, respectively. The estimated open-circuit voltage for the hetero-interface three-subcell photovoltaic solar cell 300 ($V_{oc}=V_{oc1}+V_{oc2}+V_{oc3}$) was ≈2.77 V. The calculated optimal first short-circuit photocurrent density ($I_{sc1}$) for the first subcell 314, second short-circuit photocurrent density ($I_{sc2}$) for the second subcell 316, and third short-circuit photocurrent density ($I_{sc3}$) for the third subcell 318 were ≈40 mA/cm², ≈27 mA/cm², and ≈21 mA/cm², respectively. In this case, the estimated series-matched short-circuit photocurrent density ($I_{sc}$) for the three-junction photovoltaic solar cell 300 was approximately 21 mA/cm², and $I_{sc}=I_{TJ1}=I_{TJ2}=I_{sc1}=I_{sc2}=I_{sc3}$ as discussed above. The estimated ideal series-interconnected efficiencies for the first subcell 314 ($\eta_1$), second subcell 316 ($\eta_2$), and third subcell 318 ($\eta_3$) are 10%, 18%, and 24%, respectively, and the estimated ideal series-interconnected efficiency ($\eta=\eta_1+\eta_2+\eta_3$) for the hetero-interface three-junction photovoltaic solar cell 300 was ≈52% under 500 suns. In this example, (p++)MgTe/(n++) MgTe tunnel junctions were placed between subcells to improve light conversion efficiency. The antireflection coating 312, which may comprise more than one thin layer, can be made of materials with energy gaps that are greater than the energy gap of the emitter 311 of the third subcell 318 ($E_{gARC}>E_{g3E}$). For instance, the antireflection coating may be made of Cd$_2$SnO$_4$, SnO$_2$, ZnSe, TiO$_2$, MgTe, ZnO, ZnS, MgSe, ITO, MgS, MgO, SiO$_2$, and MgF$_2$ semiconductors.

Figure 4:
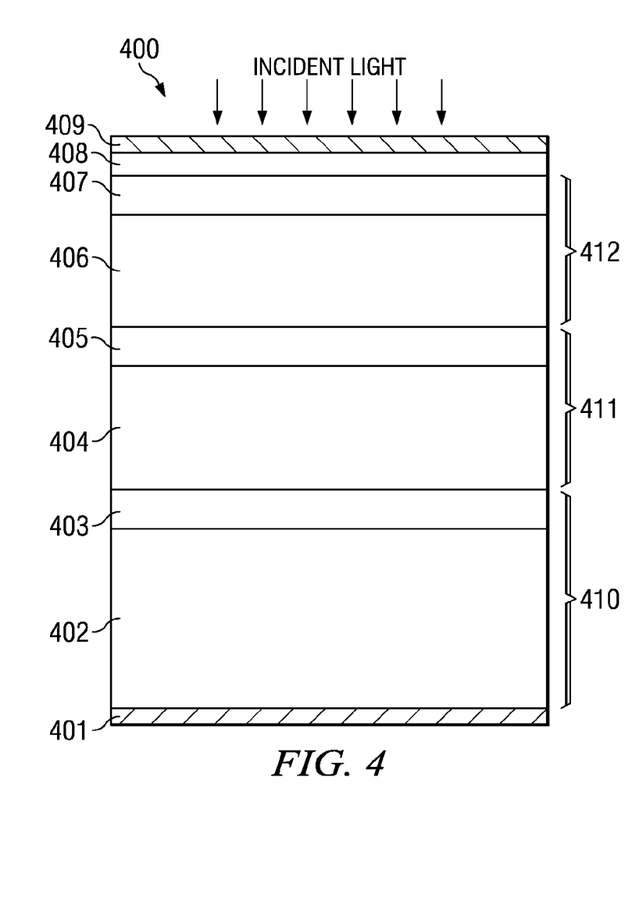
FIG. 4 is a highly magnified schematic elevational sectional view of a three junction photovoltaic solar cell according to a fourth embodiment of the present invention without tunnel junctions disposed between the subcells.

FIG. 4 illustrates a three-subcell photovoltaic solar cell 400 without intervening tunnel junctions. A representative composition is, top-to-bottom, (n+)ZnO/(n+)Cd$_{1-x}$Zn$_x$Te/(p−)Cd$_{1-x}$Zn$_x$Te/(n+)CdTe/(p−)CdTe/(n+)Si/(p−)Si. In this example, the first subcell 410, which is made of a first, preferably Group IV material system, comprises a first (p−)Si base layer 402 and a first (n+)Si emitter layer 403 having a first base energy gap ($E_{g1E}$≈1.10 eV), a first emitter energy gap ($E_{g1E}$26 1.10 eV), and a first layer thickness ($d_1$≈1.0 to 500 μm, preferably greater than or equal to 2 μm). The second subcell 411, which is disposed immediately adjacent to the first subcell 410 and is made of a second, preferably Group II-VI material system, comprises a second (p−)CdTe base layer 404 and a second (n+)CdTe emitter layer 405 having a second base energy gap ($E_{g2B}$≈1.51 eV), a second emitter energy gap ($E_{g2E}$≈1.51 eV), and a second layer thickness ($d_2$≈0.5 to 15 μm). A third subcell 412, which is disposed immediately adjacent to the second subcell 411 and is made of a third, preferably Group II-VI material system, comprises a third (p−)Cd$_{1-x}$Zn$_x$Te base layer 406 and a third (n+)Cd$_{1-x}$Zn$_x$Te emitter layer 407 having a third base energy gap ($E_{g3B}$≈1.71 eV), a third emitter energy gap ($E_{g3E}$≈1.71 eV), and a third layer thickness ($d_3$≈0.1 to 10 μm, preferably 2-6 μm). The first subcell 410, second subcell 411 and third subcell 412 of this homo-junction photovoltaic solar cell 400 can be replaced with hetero-junction subcells as described above to further improve incident light absorption.

In another variation of the second embodiment of the present invention, the (p−) and (n) semiconductor layers of the three-junction photovoltaic solar cell are reversed.

Figure 5:
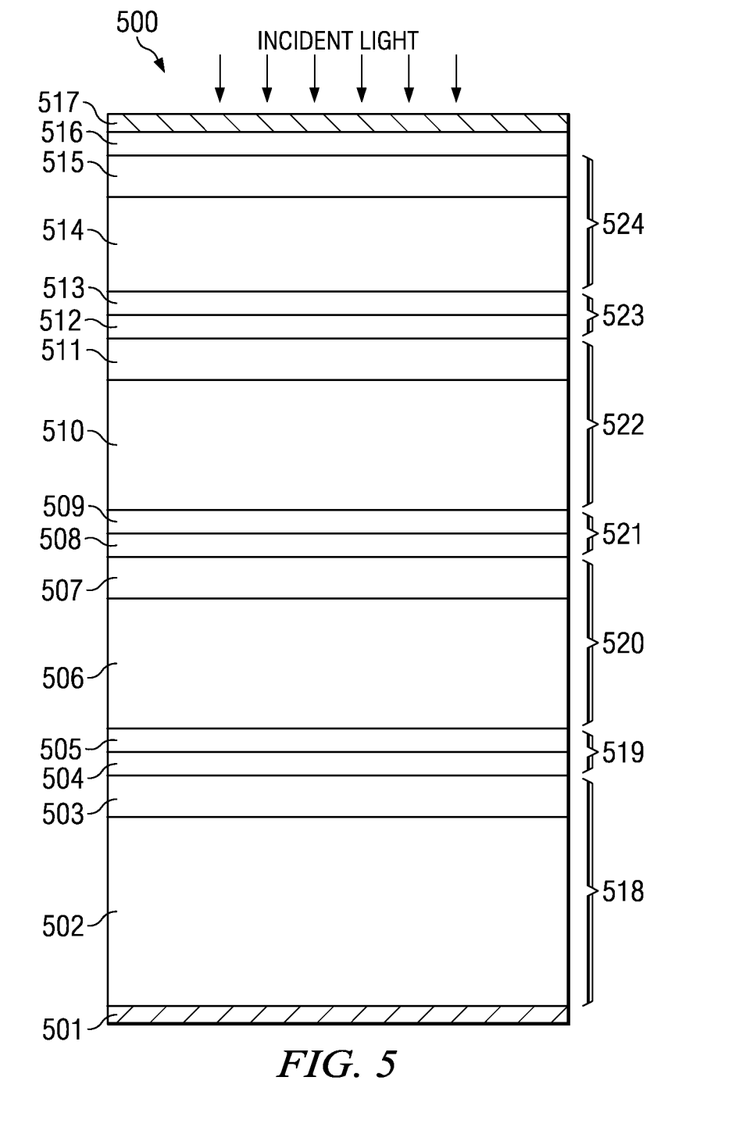
FIG. 5 is a highly magnified schematic elevational sectional view of a four junction photovoltaic solar cell according to a fifth embodiment of the present invention.

In another embodiment of the present invention, the important features of a four-subcell photovoltaic solar cell are schematically illustrated in FIG. 5. This embodiment adds to the embodiment shown in FIG. 3 with an additional subcell and tunnel junction. The composition of a preferred four-subcell photovoltaic solar cell 500 is, from top-to-bottom, (n+)ZnO/(n+)Cd$_{1-y}$Zn$_y$Te/(p−)Cd$_{1-y}$Zn$_y$Te/(p++)ZnTe/(n++)ZnTe/(n+)Cd$_{1-x}$Zn$_x$Te/(p−)Cd$_{1-x}$Zn$_x$Te/(p++)ZnTe/(n++)ZnTe/(n+)CdTe/(p−)CdTe/(p++)ZnTe/(n++)ZnTe/(n+)Si/(p−)Si, where the mole fraction x≈0.31 and y≈0.58. Cell 500 includes a first subcell 518, a second subcell 520, a third subcell 522, a fourth subcell 524, a first tunnel junction 519 between subcells 518 and 520, a second tunnel junction 521 between subcells 520 and 522, a third tunnel junction 523 between subcells 522 and 524, an antireflection coating 516 disposed over the topmost subcell 522, a front contact 517, and a back contact 501.

The fourth subcell 524, which is disposed over and in optical communication with the third subcell 522, is made of a fourth, preferably Group II-VI material system, more preferably comprising a fourth (p−)Cd$_{1-y}$Zn$_y$Te base layer 514 and a fourth (n+)Cd$_{1-y}$Zn$_y$Te emitter layer 515 having a fourth base energy gap ($E_{g4B}$≈1.7 to 2.0 eV), a fourth emitter energy gap ($E_{g4E}$≈1.8 to 2.26 eV), and a fourth layer thickness ($d_4$≈0.1 to 10 μm, preferably 2-6 μm).

The degenerately alloyed third tunnel junction 523 that is placed between the third subcell 522 and fourth subcell 524 preferably comprises a third (p++)ZnTe base layer 512 and a third (n++) ZnTe emitter layer 513 having a relatively high base energy gap ($E_{gTJ3B}$≈2.26 eV) and a relatively high emitter energy gap ($E_{gTJ3E}$≈2.26 eV). The first tunnel junction 519, second tunnel junction 521, and third second tunnel junction 523 need not be identical and the tunnel junctions 519, 521, and 523 can be made from materials of different energy gaps. The energy gaps ($E_{gTJ1B}$ and $E_{gTJ1E}$) of the first tunnel junction 519 must be greater than those of the first emitter 503 ($E_{g1E}$) of the first subcell 518 and the second base 506 ($E_{g2B}$) of the second subcell 520; the energy gaps ($E_{gTJ2B}$ and $E_{gTJ2E}$) of the second tunnel junction 521 must be greater than those of the second emitter 507 ($E_{g2E}$) of the second subcell 520 and the third base 510 ($E_{g3B}$) of the third subcell 522; the energy gaps ($E_{gTJ3B}$ and $E_{gTJ3E}$) of the third tunnel junction 523 must be greater than those of the third emitter 511 ($E_{g3E}$) of the third subcell 522 and the fourth base 514 ($E_{g4B}$) of the fourth subcell 524. The first, second, and third tunnel junctions may be one or more layers of at least one alloy of ZnTe, ZnS, ZnO, MgTe, CdMnTe ($E_{gTJ3}$ 2.0 to 2.92 eV), CdZnTe ($E_{gTJ3}$ 2.0 to 2.26 eV), and CdMgTe ($E_{gTJ3}$ 2.0 to 3.2 eV).

In this embodiment light that is incident on the top surface of the four-subcell photovoltaic solar cell 500 is partially reflected and partially transmitted through the contact layer 517 and the antireflection coating 516. The transmitted photons with energies ($E_{ph} \geq E_{g4B}$) equal to or greater than the fourth base energy gap of the fourth subcell 524 are absorbed in the fourth subcell 524, producing a fourth short-circuit photocurrent density ($I_{sc4}$) and a fourth open-circuit photovoltage ($V_{oc4}$). The photons with energies ($E_{ph} < E_{g4B}$) less than the fourth base energy gap of the fourth subcell 524 pass through the fourth subcell 524 and the third tunnel junction 523 impinging on the top of the third subcell 522. The transmitted photons with energies ($E_{ph} \geq E_{g3B}$) equal to or greater than the third base energy gap of the third subcell 522 are absorbed in the third subcell 522, producing a third short-circuit photocurrent density ($I_{sc3}$) and a third open-circuit photovoltage ($V_{oc3}$). The photons with energies ($E_{ph} < E_{g3B}$) less than the third base energy gap of the third subcell 522 pass through the third subcell 522 and the second tunnel junction 521, reaching the top of the second subcell 520.

The transmitted photons with energies ($E_{ph} \geq E_{g2B}$) equal to or greater than the second base energy gap of the second subcell 520 are absorbed in the second subcell 520, producing a second short-circuit photocurrent density ($I_{sc2}$) and a second open-circuit photovoltage ($V_{oc2}$). The photons with energies ($E_{ph} < E_{g2B}$) less than the second base energy gap of the second subcell 520 pass through the second subcell 520 and the first tunnel junction 519, arriving at the top of the first subcell 518. The transmitted photons with energies ($E_{ph} \geq E_{g1B}$) equal to or greater than the first base energy gap of the first subcell 518 are absorbed in the first subcell 518, producing a first short-circuit photocurrent density ($I_{sc1}$) and a first open-circuit photovoltage ($V_{oc1}$). The thicknesses of the first subcell 518, second subcell 520, third subcell 522, and fourth subcell 524 are chosen and optimized so that the first short-circuit photocurrent density for the first subcell 518, second short-circuit photocurrent density for the second subcell 520, third short-circuit photocurrent density for the third subcell 522, and fourth short-circuit photocurrent density for the fourth subcell 524 are matched completely ($I_{sc1}=I_{sc2}=I_{sc3}=I_{sc4}$) or substantially ($I_{sc1} \approx I_{sc2} \approx I_{sc3} \approx I_{sc4}$).

In a specific example of this embodiment, the calculated first open-circuit photovoltage ($V_{oc1}$) for the first subcell 518, second open-circuit photovoltage ($V_{oc2}$) for the second subcell 520, third open-circuit photovoltage ($V_{oc3}$) for the third subcell 522, and fourth open-circuit photovoltage ($V_{oc4}$) for the fourth subcell 524 were ≈0.51 V, ≈0.91 V, ≈1.15 V, and ≈1.44 V, respectively. The estimated open-circuit voltage for the four-junction photovoltaic solar cell 500 ($V_{oc}=V_{oc1}+V_{oc2}+V_{oc3}+V_{oc4}$) was ≈4.01 V.

The calculated optimal first short-circuit photocurrent density ($I_{sc1}$) for the first subcell 518, second short-circuit photocurrent density ($I_{sc2}$) for the second subcell 520, third short-circuit photocurrent density ($I_{sc3}$) for the third subcell 522, and fourth short-circuit photocurrent density ($I_{sc4}$) for the fourth subcell 524 were ≈40 mA/cm², ≈27 mA/cm², ≈19 mA/cm², and ≈15 mA/cm², respectively. From these numerical calculations, the estimated series-matched current density ($I_{sc}$) for the four-junction photovoltaic solar cell 500 was approximately 15 mA/cm², and $I_{sc}=I_{TJ1}=I_{TJ2}=I_{TJ3}=I_{sc1}=I_{sc2}=I_{sc3}=I_{sc4}$ as discussed above.

The estimated ideal series-interconnected efficiency ($\eta=\eta_1+\eta_2+\eta_3+\eta_4$) for the four-junction photovoltaic solar cell 500 was at least ≈45% under 500 suns. As described in the second embodiment of the present invention, ($p^{++}$)ZnTe/($n^{++}$)ZnTe tunnel junctions were placed between the subcells to improve the light conversion efficiency.

The first subcell 518, second subcell 520, third subcell 522, and fourth subcell 524 of this homo-junction photovoltaic solar cell 500 illustrated in FIG. 5 can be replaced with hetero-junction subcells to further improve performance by minimizing the absorption in the first emitter 518, second emitter 520, third emitter 522, and fourth emitter 524 while maximizing the absorption in the first base 502 of the first subcell 518, second base 506 of the second subcell 520, third base 510 of the third subcell 522, and fourth base 514 of the fourth subcell 524.

Furthermore, the fourth (n+)$Cd_{1-y}Zn_y$Te emitter 515 of the fourth subcell 524 can be replaced by alloys with a higher energy gap (n+)ZnTe emitter ($E_{g4E} \approx 2.26$ eV), (n+)CdS emitter ($E_{g4E} \approx 2.46$ eV), (n+)ZnSe emitter ($E_{g4E} \approx 2.72$ eV), (n+)MgTe emitter ($E_{g4E} \approx 3.40$ eV), (n+)ZnS emitter ($E_{g4E} \approx 3.73$ eV), (n+)CdZnTe emitter ($E_{g4E} \approx 1.8$ to 2.26 eV), (n+)CdMnTe emitter ($E_{g4E} \approx 1.8$ to 3.0 eV), or (n+)CdMgTe emitter ($E_{g4E} \approx 1.80$ to 3.2 eV) to allow more incident light to reach the (p−)$Cd_{1-y}Zn_y$Te base 514 ($E_{g4B} \approx 1.91$ eV) in order to increase the photo-generation of electron-hole pairs and hence increase the photocurrent of the fourth subcell 524.

The fourth semiconductor base material may be alloys of a CdZnTe ($E_{g4B}$ 1.7 to 2.0 eV) semiconductor or a CdMgTe ($E_{g4B}$ 1.7 to 2.0 eV) semiconductor.

Modeling was performed for a hetero-interface four-junction photovoltaic solar cell having the following top-to-bottom composition: (n+)ZnO/(n+)ZnTe/(p−)$Cd_{1-y}Zn_y$Te/($p^{++}$)MgTe/(n+)ZnTe/(p−)$Cd_{1-x}Zn_x$Te/($p^{++}$)MgTe/($n^{++}$)MgTe/(n+)ZnTe/(p−)CdTe/($p^{++}$)MgTe/($n^{++}$)MgTe/(n+)ZnTe/(p−)Si. The calculated first open-circuit photovoltage ($V_{oc1}$) for the first subcell 518, second open-circuit photovoltage ($V_{oc2}$) for the second subcell 520, third open-circuit photovoltage ($V_{oc3}$) for the third subcell 522, and fourth open-circuit photovoltage ($V_{oc4}$) for the fourth subcell 524 were ≈0.52 V, ≈0.93 V, ≈1.18 V, and ≈1.44 V, respectively. The estimated open-circuit voltage for the four-junction photovoltaic solar cell 500 ($V_{oc}=V_{oc1}+V_{oc2}+V_{oc3}+V_{oc4}$) was ≈4.07 V.

The calculated optimal first short-circuit photocurrent density ($I_{sc1}$) for the first subcell 518, second short-circuit photocurrent density ($I_{sc2}$) for the second subcell 520, third short-circuit photocurrent density ($I_{sc3}$) for the third subcell 522, and fourth short-circuit photocurrent density ($I_{sc4}$) for the fourth subcell 524 were ≈40 mA/cm², ≈27 mA/cm², ≈21 mA/cm², and ≈16 mA/cm², respectively. In this case, the estimated series-matched short-circuit photocurrent density ($I_{sc}$) for the hetero-interface four-junction photovoltaic solar cell 500 was approximately 16 mA/cm², and $I_{sc}=I_{TJ1}=I_{TJ2}=I_{TJ3}=I_{sc1}=I_{sc2}=I_{sc3}=I_{sc4}$ as discussed above.

The estimated ideal series-interconnected efficiencies for the first subcell 518 ($\eta_1$), second subcell 520 ($\eta_2$), third subcell 522 ($\eta_3$), and fourth subcell 524 ($\eta_4$) were 7%, 12%, 18%, and 21%, respectively, and the estimated ideal series-interconnected efficiency ($\eta=\eta_1+\eta_2+\eta_3+\eta_4$) for the hetero-interface four-junction photovoltaic solar cell 500 was ≈58% under 500 suns. In this particular example, (p++) MgTe/(n++) MgTe tunnel junctions were placed between the subcells to improve light conversion efficiency. The antireflection coating 516, which may comprise more than one thin layer, can be made of materials with energy gaps that are greater than the energy gap of the emitter 515 of the fourth subcell 524 ($E_{gARC}>E_{g4E}$). For instance, the antireflection coating can be made of (n+)MgTe ($E_{gARC}\approx3.40$ eV) semiconductor thin layer.

Figure 6:
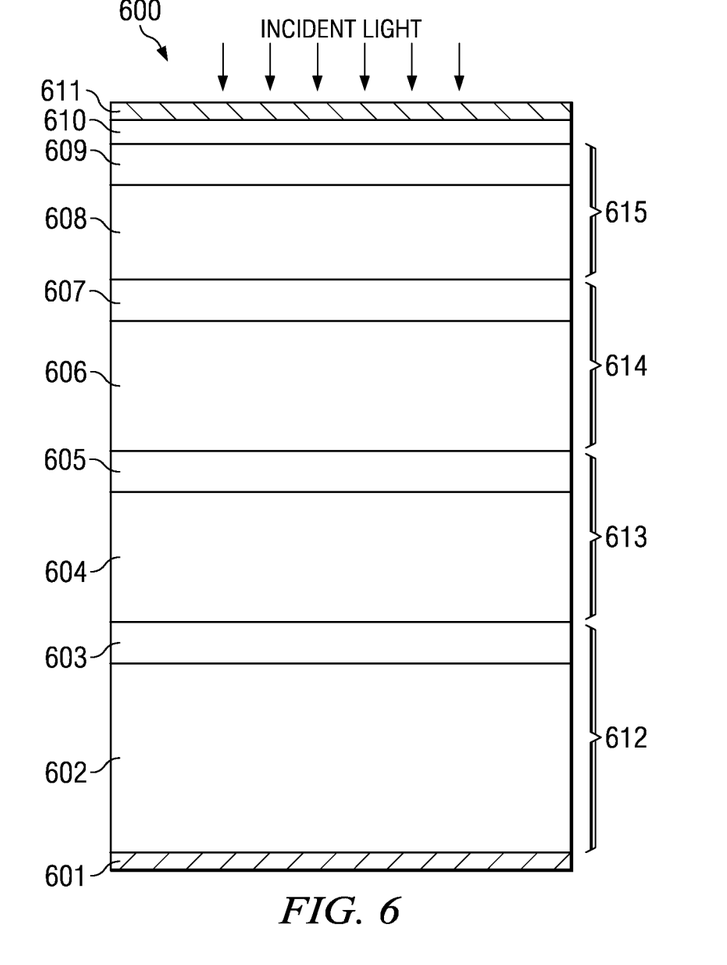
FIG. 6 is a highly magnified schematic elevational sectional view of a four junction photovoltaic solar cell according to a sixth embodiment of the present invention without tunnel junctions disposed between the subcells.

FIG. 6 shows a four-subcell photovoltaic cell 600 without tunnel junctions. A top-to-bottom composition of cell 600 can be (n+)ZnO/(n+)$Cd_{1-y}Zn_y$Te/(p−)$Cd_{1-y}Zn_y$Te/(n+)$Cd_{1-x}Zn_x$Te/(p−)$Cd_{1-x}Zn_x$Te/(n+)CdTe/(p−)CdTe/(n+)Si/(p−)Si. In this example, the first subcell 612, which is made of a first, preferably Group IV material system, more preferably comprises a first (p−)Si base layer 602 and a first (n+)Si emitter layer 603 having a first base energy gap ($E_{g1B}\approx1.10$ eV), a first emitter energy gap ($E_{g1E}\approx1.10$ eV), and a first layer thickness ($d_1\approx11.0$ to 500 μm, preferably at least 2 μm). The second subcell 613, which is disposed immediately adjacent to the first subcell 612 and is made of a second, preferably Group II-VI material system, more preferably comprises a second (p−)CdTe base layer 604 and a second (n+)CdTe emitter layer 605 having a second base energy gap ($E_{g2B}\approx1.51$ eV), a second emitter energy gap ($E_{g2E}\approx1.51$ eV), and a second layer thickness ($d_2\approx0.5$ to 15 μm, preferably 2 to 6 μm). The third subcell 614, which is disposed immediately adjacent to the second subcell 613 and is made of a third, preferably Group II-VI material system, more preferably comprises a third (p−)$Cd_{1-x}Zn_x$Te base layer 606 and an (n+) $Cd_{1-x}Zn_x$Te emitter layer 607 having a third energy gap ($E_{g3}\approx1.71$ eV) and a third layer thickness ($d_3\approx0.1$ to 10 μm, preferably 2 to 6 μm). The fourth subcell 615, which is disposed immediately adjacent to the third subcell 614 and is made of a fourth, preferably Group II-VI material system, more preferably comprises a (p−)$Cd_{1-y}Zn_y$Te base layer 608 and a fourth (n+)$Cd_{1-y}Zn_y$Te emitter layer 609 having a fourth base energy gap ($E_{g4B}\approx1.91$ eV), a fourth emitter energy gap ($E_{g4E}\approx1.91$ eV), and a fourth layer thickness ($d_4\approx0.1$ to 10 μm). The first subcell 612, second subcell 613, third subcell 614, and fourth subcell 615 of the homo-junction photovoltaic solar cell 600 can be replaced with hetero-junction subcells as described above to further improve incident light absorption.

In another variation of this embodiment, the (p−) and (n) semiconductor layers of the four-subcell photovoltaic solar cell are reversed.

Figure 7:
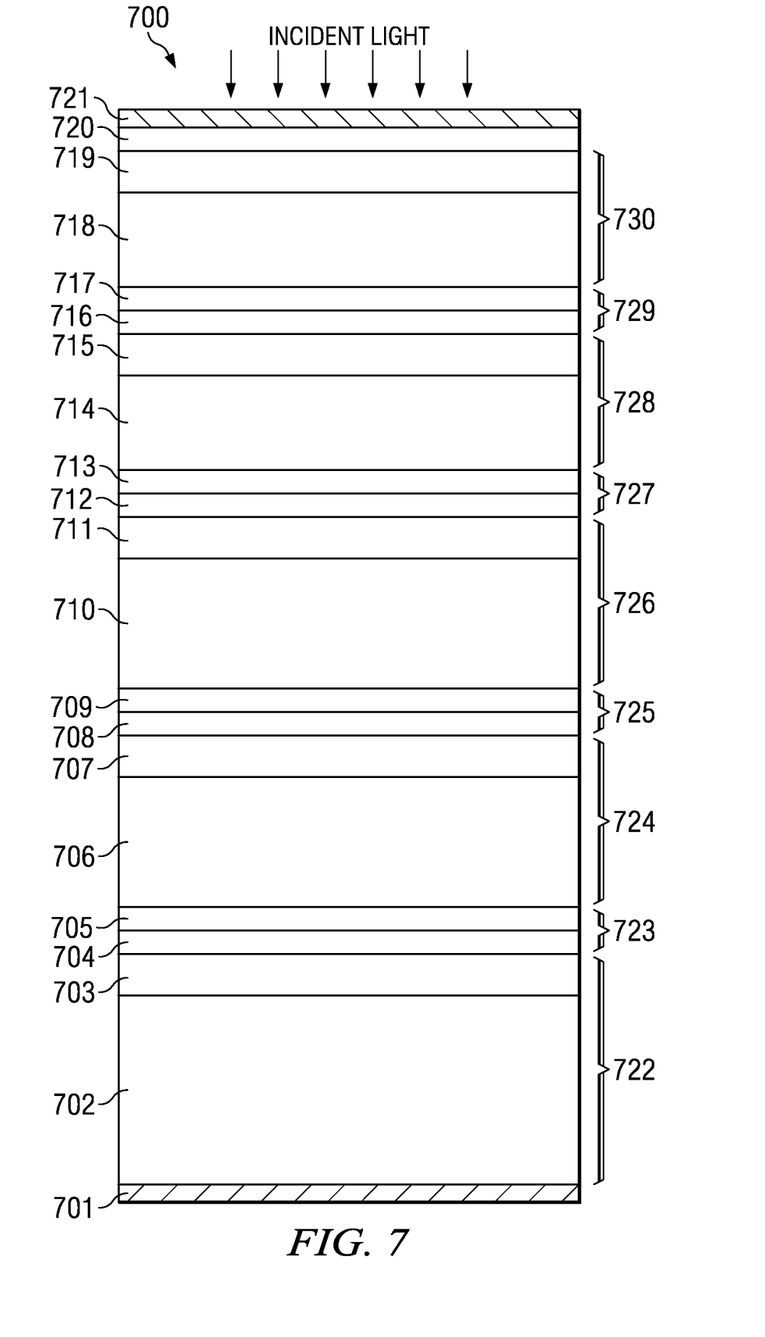
FIG. 7 is a highly magnified schematic elevational sectional view of a five junction photovoltaic solar cell according to a seventh embodiment of the present invention.

In another embodiment of the present invention, the main features of a five-junction photovoltaic solar cell are schematically illustrated in FIG. 7. This embodiment adds, to the embodiment shown in FIG. 5, an additional subcell and tunnel junction. A preferred composition of the five-subcell photovoltaic solar cell 700 is, from top to bottom, (n+)ZnO/(n+)$Cd_{1-z}Zn_z$Te/(p−)$Cd_{1-z}Zn_z$Te/(p++)ZnTe/(n++)ZnTe/(n+) $Cd_{1-y}Zn_y$Te/(p−)$Cd_{1-y}Zn_y$Te/(p++)ZnTe/(n++)ZnTe/(n+)$C_{1-x}Zn_x$Te/(p−)$Cd_{1-x}Zn_x$Te/(p++)ZnTe/(n++)ZnTe/(n+)CdTe/(p−)CdTe/(p++)ZnTe/(n++)ZnTe/(n+)Si/(p−)Si, where the mole fraction x≈0.31, y≈0.58, and z≈0.70. Cell 700 includes a first subcell 722, a second subcell 724, a third subcell 726, a fourth subcell 728, a fifth subcell 730, a first tunnel junction 723 between subcells 722 and 724, a second tunnel junction 725 between subcells 724 and 726, a third tunnel junction 727 between subcells 726 and 728, a fourth tunnel junction 729 between subcells 728 and 730, an antireflection coating 720 formed to be disposed over the topmost subcell 730, a front contact 721, and a back contact 701.

The fifth subcell 730 is disposed over and in optical communication with the fourth subcell 728, and is made of a fifth, preferably II-VI material system, more preferably comprising a fifth (p−)$Cd_{1-z}Zn_z$Te base layer 718 and a fifth (n+)$Cd_{1-z}Zn_z$Te emitter layer 719, having a fifth base energy gap ($E_{g5B}\approx2.00$ eV), a fifth emitter energy gap ($E_{g5E}\approx2.00$ eV), and a fifth layer thickness ($d_5\approx0.1$ to 10 μm). The degenerately alloyed fourth tunnel junction 729 that is placed between the fourth subcell 728 and fifth subcell 730 preferably comprises a fourth (p++)ZnTe base layer 716 and a fourth (n++)ZnTe emitter layer 717 having a relatively high base energy gap ($E_{gTJ4B}\approx2.26$ eV) and a relatively high emitter energy gap ($E_{gTJ4E}\approx2.26$ eV).

The first tunnel junction 723, second tunnel junction 725, third tunnel junction 727, and fourth tunnel junction 729 need not be identical and the tunnel junctions 723, 725, 727, 729 can be made from materials of different energy gaps. The energy gaps ($E_{gTJ1B}$ and $E_{gTJ1E}$) of the first tunnel junction 723 must be greater than those of the first emitter 703 ($E_{gE1}$) of the first subcell 722 and the second base 706 ($E_{g2B}$) of the second subcell 724; the energy gaps ($E_{gTJ2B}$ and $E_{gTJ2E}$) of the second tunnel junction 725 must be greater than those of the second emitter 707 ($E_{g2E}$) of the second subcell 724 and the third base 710 ($E_{g3B}$) of the third subcell 726; the energy gaps ($E_{gTJ3B}$ and $E_{gTJ3E}$) of the third tunnel junction 727 must be greater than those of the third emitter 711 ($E_{g3E}$) of the third subcell 726 and the fourth base 714 ($E_{g4B}$) of the fourth subcell 728; and the energy gaps ($E_{gTJ4B}$ and $E_{gTJ4E}$) of the fourth tunnel junction 729 must be greater than those of the fourth emitter 715 ($E_{g4E}$) of the fourth subcell 728 and the fifth base 718 ($E_{g5B}$) of the fifth subcell 730. The first, second, third, and fourth tunnel junctions may be one or more alloyed semiconductor layers of ZnTe, ZnS, MgTe, ZnO, CdZnTe ($E_{gTJ4}\approx2.0$ to 2.26 eV), CdMgTe ($E_{gTJ4}\approx2.0$ to 3.4 eV), and CdMnTe ($E_{gTJ4}\approx2.0$ to 2.92 eV).

Light that is incident on the top surface of the five-junction photovoltaic solar cell 700 is partially reflected and partially transmitted through the contact layer 721 and the antireflection coating 720. The transmitted photons with energies ($E_{ph}\geq E_{g5B}$) equal to or greater than the fifth base energy gap of the fifth subcell 730 are absorbed in the fifth subcell 730, producing a fifth short-circuit photocurrent density ($I_{sc5}$) and a fifth open-circuit photovoltage ($V_{oc5}$). The photons with energies ($E_{ph}<E_{g5B}$) less than the fifth base energy gap of the fifth subcell 730 pass through the fifth subcell 730 and the fourth tunnel junction 729, impinging on the top of the fourth subcell 728. The transmitted photons with energies ($E_{ph}\geq E_{g4B}$) equal to or greater than the fourth base energy gap of the fourth subcell 728 are absorbed in the fourth subcell 728, producing a fourth short-circuit photocurrent density ($I_{sc4}$) and a fourth open-circuit photovoltage ($V_{oc4}$). Photons with energies ($E_{ph}<E_{g4B}$) less than the fourth base energy gap of the fourth subcell 728 pass through the fourth subcell 728 and the third tunnel junction 727, reaching the top of the third subcell 726.

The transmitted photons with energies ($E_{ph}\geq E_{g3B}$) equal to or greater than the third base energy gap of the third subcell 726 are absorbed in the third subcell 726, producing a third short-circuit photocurrent density ($I_{sc3}$) and a third open-circuit photovoltage ($V_{oc3}$). The photons with energies ($E_{ph}<E_{g3B}$) less than the third base energy gap of the third subcell 726 pass through the third subcell 726 and the second tunnel junction 725, arriving at the top of the second subcell 724. The transmitted photons with energies ($E_{ph}\geq E_{g2B}$) equal to or greater than the second base energy gap of the second subcell 724 are absorbed in the second subcell 724, producing a second short-circuit photocurrent density ($I_{sc2}$) and a second open-circuit photovoltage ($V_{oc2}$). The photons with energies ($E_{ph}<E_{g2B}$) less than the second base energy gap of the second subcell 724 pass through the second subcell 724 and the first tunnel junction 723, arriving the top of the first subcell 722. The transmitted photons with energies ($E_{ph} \geq E_{g1B}$) equal to or greater than the first base energy gap of the first subcell 722 are absorbed in the first subcell 722, producing a first short-circuit photocurrent density ($I_{sc1}$) and a first open-circuit photovoltage ($V_{oc1}$).

The thicknesses of the first subcell 722, second subcell 724, third subcell 726, fourth subcell 728, and fifth subcell 730 are varied and optimized so that the first short-circuit photocurrent density ($I_{sc1}$) for the first subcell, second short-circuit photocurrent density ($I_{sc2}$) for the second subcell, third short-circuit photocurrent density ($I_{sc3}$) for the third subcell, fourth short-circuit photocurrent density ($I_{sc4}$) for the fourth subcell, and fifth short-circuit photocurrent density ($I_{sc5}$) for the fifth subcell are matched completely ($I_{sc1}=I_{sc2}=I_{sc3}=I_{sc4}=I_{sc5}$) or substantially ($I_{sc1} \approx I_{sc2} \approx I_{sc3} \approx I_{sc4} \approx I_{sc5}$).

In a specific example of this embodiment, the calculated first open-circuit photovoltage ($V_{oc1}$) for the first subcell 722, second open-circuit photovoltage ($V_{oc2}$) for the second subcell 724, third open-circuit voltage ($V_{oc3}$) for the third subcell 726, fourth open-circuit photovoltage ($V_{oc4}$) for the fourth subcell 728, and fifth open-circuit photovoltage ($V_{oc5}$) for the fifth subcell 730 were $\approx 0.50$ V, $\approx 0.90$ V, $\approx 1.12$ V, $\approx 1.36$ V, and $\approx 1.51$ V, respectively. The estimated open-circuit voltage for the five-subcell photovoltaic solar cell 700 ($V_{oc}=V_{oc1}+V_{oc2}+V_{oc3}+V_{oc4}+V_{oc5}$) was $\approx 5.39$ V.

The calculated optimal first short-circuit photocurrent density ($I_{sc1}$) for the first subcell 722, second short-circuit photocurrent density ($I_{sc2}$) for the second subcell 724, third short-circuit photocurrent density ($I_{sc3}$) for the third subcell 726, fourth short-circuit photocurrent density ($I_{sc4}$) for the fourth subcell 728, and fifth short-circuit photocurrent density ($I_{sc5}$) for the fifth subcell 730 are $\approx 40$ mA/cm$^2$, $\approx 27$ mA/cm$^2$, $\approx 19$ mA/cm$^2$, $\approx 15$ mA/cm$^2$, and $\approx 13$ mA/cm$^2$, respectively. From these numerical calculations, the estimated series-matched current density ($I_{sc}$) for the five-junction photovoltaic solar cell 700 was approximately 13 mA/cm$^2$, and $I_{sc}=I_{TJ1}=I_{TJ2}=I_{TJ3}=I_{TJ4}=I_{sc1}=I_{sc2}=I_{sc3}=I_{sc4}=I_{sc5}$ as discussed above.

The estimated ideal series-interconnected efficiency ($\eta=\eta_1+\eta_2+\eta_3+\eta_4+\eta_5$) for the five-subcell photovoltaic solar cell 700 was at least $\approx 50\%$ under 500 suns. As described above for other embodiments of the invention, (p$^{-+}$)ZnTe/(n$^{++}$)ZnTe tunnel junctions may be placed between the subcells to improve light conversion efficiency.

The first subcell 722, second subcell 724, third subcell 726, fourth subcell 728, and fifth subcell 730 of this homo-junction photovoltaic solar cell 700 can be replaced with hetero-junction subcells to further improve the performance by minimizing the absorption in the first emitter 703, second emitter 707, third emitter 711, fourth emitter 715, and fifth emitter 719 while maximizing the absorption in the first base 702 of first subcell 722, second base 706 of the second subcell 724, third base 710 of the third subcell 726, fourth base 714 of the fourth subcell 728, and fifth base 718 of the fifth subcell 730.

Moreover, the fifth (n+)Cd$_{1-z}$Zn$_z$Te emitter 719 of the fifth subcell 730 can be replaced with a higher energy gap alloys such as (n+)ZnTe emitter ($E_{g4E} \approx 1.8$ to 2.26 eV), (n+)CdS emitter ($E_{g5E} \approx 2.46$ eV), (n+)ZnSe emitter ($E_{g5E} \approx 2.72$ eV), (n+)MgTe emitter ($E_{g5E} \approx 3.40$ eV), (n+)ZnS emitter ($E_{g5E} \approx 3.73$ eV), (n+)CdZnTe emitter ($E_{g5E} \approx 1.8$ to 2.26 eV), (n+)CdMnTe emitter ($E_{g5E} \approx 1.8$ to 2.92 eV), or (n+)CdMgTe emitter ($E_{g5E} \approx 1.8$ to 3.40 eV) to allow more incident light to reach the (p−)Cd$_{1-z}$Zn$_z$Te base 718 ($E_{g5B} \approx 2.00$ eV) in order to increase the photo-generation of electron-hole pairs and hence increase the photocurrent of the fifth subcell 730.

Additionally, the fifth semiconductor base may be alloys of CdZnTe ($E_{g5E} \approx 1.8$-2.26 eV) or CdMgTe ($E_{g5E} \approx 1.8$-3.2 eV).

Numerical modeling was performed for a hetero-interface three-junction photovoltaic solar cell having the following top-to-bottom composition: (n+)ZnO/(n+)ZnTe/(p−)Cd$_{1-z}$Zn$_z$Te/(p$^{++}$)MgTe/(n+)ZnTe/(p−)Cd$_{1-y}$Zn$_y$Te/(p$^{++}$)MgTe/(n+)ZnTe/(p−)Cd$_{1-n}$n$_z$Te/(p$^{++}$)MgTe/(n$^{++}$)MgTe/(n+)ZnTe/(p−)CdTe/(p$^{++}$)MgTe/(n$^{++}$)MgTe/(n+)ZnTe/(p−)Si.

The calculated first open-circuit photovoltage ($V_{oc1}$) for the first subcell 722, second open-circuit photovoltage ($V_{oc2}$) for the second subcell 724, third open-circuit photovoltage ($V_{oc3}$) for the third subcell 726, fourth open-circuit photovoltage ($V_{oc4}$) for the fourth subcell 728, and fifth open-circuit photovoltage ($V_{oc4}$) for the fifth subcell 730 were $\approx 0.50$ V, $\approx 0.89$ V, $\approx 1.11$ V, $\approx 1.36$ V, and $\approx 1.51$ V, respectively. The estimated open-circuit voltage ($V_{oc}=V_{oc1}+V_{oc2}+V_{oc3}+V_{oc4}+V_{oc5}$) for the hetero-interface five-junction photovoltaic solar cell 700 was $\approx 5.37$ V.

The calculated optimal first short-circuit photocurrent density ($I_{sc1}$) for the first subcell 722, second short-circuit photocurrent density ($I_{sc2}$) for the second subcell 724, third short-circuit photocurrent density ($I_{sc3}$) for the third subcell 726, fourth short-circuit photocurrent density ($I_{sc4}$) for the fourth subcell 728, and fifth short-circuit photocurrent density ($I_{sc5}$) for the fifth subcell 730 were $\approx 40$ mA/cm$^2$, $\approx 27$ mA/cm$^2$, $\approx 19$ mA/cm$^2$, $\approx 15$ mA/cm$^2$, and $\approx 13$ mA/cm$^2$, respectively. In this case, the estimated series-matched short-circuit photocurrent density ($I_{sc}$) for the five-junction photovoltaic solar cell 700 again was approximately 13 mA/cm$^2$, and $I_{sc}=I_{TJ1}=I_{TJ2}=I_{TJ3}=I_{TJ4}=I_{sc1}=I_{sc2}=I_{sc3}=I_{sc4}=I_{sc5}$ as discussed above.

The estimated ideal series-interconnected efficiency ($\eta=\eta_1+\eta_2+\eta_3+\eta_4+\eta_5$) for the hetero-interface five-subcell photovoltaic solar cell 700 again was at least $\approx 55\%$ under 500 suns. In this particular example, (p$^{++}$)MgTe/(n$^{++}$)MgTe tunnel junctions were placed between the subcells to improve the light conversion efficiency. The antireflection coating 720, which may comprise of more than one thin layer, can be made of materials with energy gaps that are greater than the energy gap of the emitter 719 of the fifth subcell 730 ($E_{gARC}>E_{g5E}$). For instance, the antireflection coating can be made of an (n+)MgTe ($E_{gARC} \approx 3.40$ eV) semiconductor thin layer.

Figure 8:
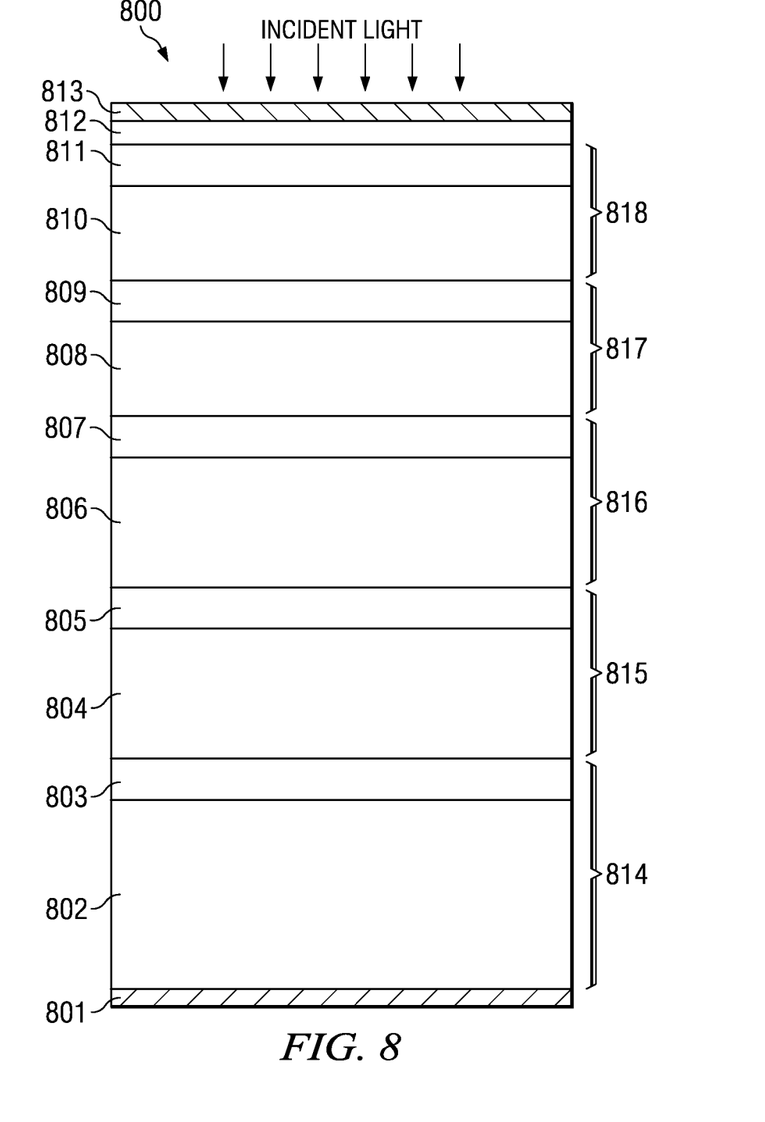
FIG. 8 is a highly magnified schematic elevational sectional view of a five junction photovoltaic solar cell according to a eighth embodiment of the present invention without tunnel junctions disposed between the subcells.

FIG. 8 shows a five-subcell solar cell 800 which can have the following top-to-bottom composition: (n+)ZnO/(n+)Cd$_{1-z}$Zn$_z$Te/(p−)Cd$_{1-z}$Zn$_z$Te/(n+)Cd$_{1-y}$Zn$_y$Te/(p−)Cd$_{1-y}$Zn$_y$Te/(n+)Cd$_{1-x}$Zn$_x$Te/(p−)Cd$_{1-x}$Zn$_x$Te/(n+)CdTe/(p−)CdTe/(n+)Si/(p−)Si. Cell 800 does not have tunnel junctions between its subcells. In this example, the first subcell 814, which is made of a first, preferably Group IV material system, more preferably comprises a first (p−)Si base layer 802 and a first (n+)Si emitter layer 803 having a first base energy gap ($E_{g1B} \approx 1.10$ eV), a first emitter energy gap ($E_{g1E} \approx 1.10$ eV), and a first layer thickness ($d_1 \approx 1.0$ to 500 μm, preferably greater than or equal to 2 μm). The second subcell 815, which is disposed immediately adjacent to the first subcell 814 and is made of a second, preferably Group II-VI material system, comprises a second (p−)CdTe base layer 804 and a second (n+)CdTe emitter layer 805 having a second base energy gap ($E_{g2B} \approx 1.51$ eV), second emitter energy gap ($E_{g2E} \approx 1.51$ eV), and a second layer thickness ($d_2 \approx 0.5$ to 15 μm, preferably 2-6 μm). The third subcell 816, which is disposed immediately adjacent to the second subcell 815 and is made of a third, preferably Group II-VI material system, comprises a third (p−)Cd$_{1-x}$Zn$_x$Te base layer 806 and a third (n+)Cd$_{1-x}$Zn$_x$Te emitter layer 807 having a third base energy gap ($E_{g3B} \approx 1.71$ eV), a third emitter energy gap ($E_{g3E} \approx 1.71$ eV), and a third layer thickness ($d_3 \approx 0.1$ to 10 μm, preferably 2 to 6 μm).

The fourth subcell 817, which is disposed immediately adjacent to the third subcell 816 and is made of a fourth, preferably II-VI material system, more preferably comprises a fourth (p−)$Cd_{1-y}Zn_yTe$ base layer 808 and a fourth (n+)$Cd_{1-y}Zn_yTe$ emitter layer 809 having a fourth base energy gap ($E_{g4B} \approx 1.91$ eV), a fourth base energy gap ($E_{g4E} \approx 1.91$ eV), and a fourth layer thickness ($d_4 \approx 0.1$ to 10 μm, preferably 2 to 6 μm). The fifth subcell 818, which is disposed immediately adjacent to the fourth subcell 817 and is made of a fifth, preferably Group II-VI material system, more preferably comprises a fifth (p−)$Cd_{1-z}Zn_zTe$ base layer 810 and a fifth (n+)$Cd_{1-z}Zn_zTe$ emitter layer 811 having a fifth base energy gap ($E_{g5B} \approx 2.00$ eV), a fifth emitter energy gap ($E_{g5E} \approx 2.00$ eV), and a fifth layer thickness ($d_4 \approx 0.1$ to 10 μm). The first subcell 814, second subcell 815, third subcell 816, fourth subcell 817, and fifth subcell 818 of the homo-junction photovoltaic solar cell 800 can be replaced with hetero-junction subcells as described above to further improve overall absorption of incident light.

In another variation of the fourth embodiment of the present invention, the (p−) and (n) semiconductor layers of cell 800 are reversed.

The invention discloses, for the first time, several monolithic multi-subcell photovoltaic solar cells having no Group III-V semiconductors and having ideal overall series efficiencies of at least 45% under concentrated sunlight of approximately 500 suns. These ideal energy conversion efficiencies have not been reported before for solar cells composed of any monatomic or compound semiconductor family or combination of such families or material systems (Groups IV, III-V, or II-VI).

In summary, several monolithic multi-junction or -subcell photovoltaic solar cells have been described which are fabricated of a combination of Group IV and Group II-VI materials, preferably on silicon substrates. Species, alloys, and thicknesses of successively grown layers can be selected to create solar cells having more than fifty percent ideal overall energy conversion efficiencies.

While particular preferred embodiments of the present invention have been presented in detail hereinabove for the purposes of description and illustration, it will be understood by those skilled in the art that all suitable modifications, alterations, substitutions, equivalent arrangements, and enhancements of the preferred embodiments may be made without departing from the spirit and broader scope of the invention. In particular, the Si substrate can be lifted off or thinned, an epitaxial Ge layer may be grown on the back of thinned Si for better absorption of infrared light before the epitaxial II-VI layers are grown on the opposite face of the Si, the Si substrate can be replaced by a Ge substrate or other substrate-related modifications to the preferred embodiments may be made.

We claim:

1. A monolithic multijunction photovoltaic solar cell, comprising:
    a first subcell including:
        a first base formed of a single-crystal Group IV semiconductor material to be of a first conductivity type and having a first base energy gap; and
        a first emitter formed of a single-crystal Group IV semiconductor material to be of a second conductivity type opposite the first conductivity type, the first emitter formed to adjoin the first base and having a first emitter energy gap;
    a first tunnel junction consisting of a first tunnel junction layer and a second tunnel junction layer, the first tunnel junction layer directly formed on the first emitter, the first tunnel junction layer formed of ZnTe or CdZnTe and degenerately doped to be of the first conductivity type, the second tunnel junction layer formed on the first tunnel junction layer, the second tunnel junction layer formed of ZnTe or CdZnTe and degenerately doped to be of the second conductivity type;
    a second subcell formed on the first tunnel junction and comprising:
        a second base formed of a single-crystal Group II-VI semiconductor material to be of the first conductivity type and to have a second base energy gap higher than the first base energy gap; and
        a second emitter formed of a single-crystal Group II-VI semiconductor material to be of the second conductivity type and formed to adjoin the second base; and
    wherein an overall ideal series efficiency of the solar cell calculated under 500 suns incident solar radiation is at least approximately 40%.

2. The solar cell of claim 1, wherein the first conductivity type is (p−) type.

3. The solar cell of claim 1, wherein the Group II-VI semiconductor material forming the second base is selected from the group consisting of CdS, CdTe, CdSe, ZnTe, ZnSe, ZnS, MgTe, CdSeTe, CdMnTe, CdMnTe, CdMgTe, and CdHgTe.

4. The solar cell of claim 1, wherein said second subcell has a lower face proximate to the first subcell and an upper face remote from the first subcell, the second subcell further comprising a semiconductive antireflection layer formed to adjoin the upper face and comprising at least one material selected from the group consisting of $Cd_2SnO_4$, $SnO_2$, ZnSe, $TiO_2$, MgTe, ZnO, ZnS, MgSe, ITO, MgS, MgO, $SiO_2$, and $MgF_2$.

5. The solar cell of claim 1, wherein the first subcell has an upper face proximate the second subcell and a lower face remote from the second subcell, the solar cell further comprising a conductive back contact, disposed adjacent to the lower face of the first subcell.

6. The solar cell of claim 1, wherein the second subcell has a lower face proximate to the first subcell and an upper face remote from the first subcell and a conductive front contact formed adjacent to the upper face of the second subcell.

7. The solar cell of claim 1, wherein the first base is a substrate formed of a Group IV semiconductor material selected from the group consisting of Si, Ge and Si—Ge.

8. The solar cell of claim 1, further comprising:
    a second tunnel junction formed of a third tunnel junction layer and a fourth tunnel junction layer, the third tunnel junction layer formed on the second emitter, the third tunnel junction layer formed of ZnTe or CdZnTe and degenerately doped to be of the first conductivity type, the fourth tunnel junction layer formed of ZnTe or CdZnTe, the fourth tunnel junction layer formed on the third tunnel junction layer and degenerately doped to be of the second conductivity type;
    a third subcell formed on the second tunnel junction and comprising:
        a third base formed of a single-crystal Group II-VI semiconductor material to be of the first conductivity type and having a third base energy gap higher than the second base energy gap;
        a third emitter formed of a single-crystal Group II-VI semiconductor material to be of the second conductivity type and formed to adjoin the third base, the third emitter having a third emitter energy gap higher than the second emitter energy gap; and wherein an overall ideal series efficiency of the solar cell is at least approximately 40% under 500 suns illumination.

9. The solar cell of claim 8, wherein the Group II-VI semiconductor material forming the third base is selected from the group consisting of CdS, CdTe, CdSe, ZnTe, ZnSe, ZnS, MgTe, CdSeTe, CdZnTe, CdMnTe, CdMgTe, and CdHgTe.

10. The solar cell of claim 8, wherein said third subcell has a lower face proximate to the second subcell and an upper face remote from the second subcell, the cell further comprising a semiconductive antireflection layer formed over the third subcell upper face and comprising at least one material selected from the group consisting of $Cd_2SnO_4$, $SnO_2$, ZnSe, $TiO_2$, MgTe, ZnO, ZnS, MgSe, ITO, MgS, MgO, $SiO_2$, and $MgF_2$.

11. The solar cell of claim 8, further comprising:
a third tunnel junction formed on the third subcell, the third tunnel junction formed by a fifth tunnel junction layer and a sixth tunnel junction layer, the fifth tunnel junction layer formed on the third emitter, the fifth tunnel junction layer formed of ZnTe or CdZnTe and degenerately doped to be of the first conductivity type, the sixth tunnel junction layer formed on the fifth tunnel junction layer, the sixth tunnel junction layer formed of ZnTe or CdZnTe and degenerately doped to be of the second conductivity type;
a fourth subcell formed on the third tunnel junction and comprising:
a fourth base formed of a single-crystal, Group II-VI semiconductor material of the first conductivity type and having a fourth base energy gap higher than the third base energy gap;
a fourth emitter formed of a single-crystal, Group II-VI semiconductor material of the second conductivity type and formed to adjoin the fourth base and having a fourth emitter energy gap higher than the third emitter energy gap; and
wherein an overall ideal series efficiency of the solar cell is at least approximately 45% under 500 suns illumination.

12. The solar cell of claim 11, wherein the Group II-VI semiconductor material forming the base of the fourth subcell is selected from the group consisting of CdS, CdTe, CdSe, ZnTe, ZnSe, ZnS, MgTe, CdSeTe, CdMnTe, CdMnTe, CdMgTe, and CdHgTe.

13. The solar cell of claim 11, wherein said fourth subcell further has a lower face proximate to the third subcell and an upper face remote from the third subcell, the fourth subcell further comprising a semiconductive antireflection layer formed to adjoin the fourth subcell upper face and comprising at least one material selected from the group consisting of $Cd_2SnO_4$, $SnO_2$, ZnSe, $TiO_2$, MgTe, ZnO, ZnS, MgSe, ITO, MgS, MgO, $SiO_2$, and $MgF_2$.

14. The solar cell of claim 11, further comprising:
a fourth tunnel junction formed on the fourth subcell, the fourth tunnel junction formed by a seventh tunnel junction layer and an eighth tunnel junction layer, the seventh tunnel junction layer formed on the fourth emitter, the seventh tunnel junction layer formed of ZnTe or CdZnTe and degenerately doped to be of the first conductivity type, the eighth tunnel junction layer formed on the seventh tunnel junction layer, the eighth tunnel junction layer formed of ZnTe or CdZnTe and degenerately doped to be of the second conductivity type;
a fifth subcell formed on the fourth tunnel junction and comprising:
a fifth base formed of a single-crystal, Group II-VI semiconductor material to be of the first conductivity type and having a fifth base energy gap higher than the fourth base energy gap;
a fifth emitter formed of a single-crystal, Group II-VI semiconductor material to be of the second conductivity type formed to adjoin the fifth semiconductor base and having a fifth emitter energy gap higher than the fourth emitter energy gap; and
wherein an overall ideal series efficiency of the solar cell is at least approximately 50% under 500 suns illumination.

15. The solar cell of claim 14, wherein the Group II-VI semiconductor material forming the base of the fifth subcell is selected from the group consisting of CdS, CdTe, CdSe, ZnTe, ZnSe, ZnS, MgTe, CdSeTe, CdMnTe, CdMnTe, CdMgTe, and CdHgTe.

16. The solar cell of claim 14, wherein said fifth subcell has a lower face proximate to the fourth subcell and an upper face remote from the fourth subcell, the fifth subcell further comprising a semiconductive antireflection layer formed on the upper face and comprising at least one material selected from the group consisting of $Cd_2SnO_4$, $SnO_2$, ZnSe, $TiO_2$, MgTe, ZnO, ZnS, MgSe, ITO, MgS, MgO, $SiO_2$, and $MgF_2$.

* * * * *